United States Patent [19]
Sakamoto et al.

[11] Patent Number: 5,736,875
[45] Date of Patent: Apr. 7, 1998

[54] DISCRIMINATION CIRCUIT CAPABLE OF AUTOMATICALLY OPTIMIZING DISCRIMINATION LEVEL AND DISCRIMINATION PHASE

[75] Inventors: Hisaya Sakamoto; Takashi Tsuda; Yasunori Nagakubo, all of Kawasaki, Japan

[73] Assignee: Fujitsu Limited, Kanagawa, Japan

[21] Appl. No.: 618,941

[22] Filed: Mar. 20, 1996

[30] Foreign Application Priority Data

Mar. 20, 1995 [JP] Japan ............... 7-061210

[51] Int. Cl.⁶ ............... H03K 5/153; H03K 5/22; H01L 31/00
[52] U.S. Cl. ............... 327/74; 327/76; 327/68; 327/514
[58] Field of Search ............... 327/63, 64, 68–76, 327/146, 147, 162, 163, 538, 2, 5, 7, 8, 403, 404, 77, 540, 514; 250/551

[56] References Cited

U.S. PATENT DOCUMENTS

| | | | |
|---|---|---|---|
| 3,851,259 | 11/1974 | Porawski | 327/74 |
| 3,936,755 | 2/1976 | Sheng | 327/73 |
| 4,823,360 | 4/1989 | Tremblay et al. | 327/73 |
| 5,001,726 | 3/1991 | Kawai et al. | 327/72 |
| 5,373,400 | 12/1994 | Kovacs | 327/74 |
| 5,614,857 | 3/1997 | Lim et al. | 327/74 |

*Primary Examiner*—Toan Tran
*Attorney, Agent, or Firm*—Helfgott & Karas, PC

[57] ABSTRACT

In controlling a discrimination level $V_1$, $V_1$ is controlled so that discrimination results based on discrimination levels $V_1+\Delta V$ and $V_1-\Delta V$ each become equal to the discrimination result based on the discrimination level $V_1$. If the discrimination result based on $V_1+\Delta V$ does not agree with the discrimination result based on $V_1$, $V_1$ is lowered, and if the discrimination result based on $V_1-\Delta V$ does not agree with the discrimination result based on $V_1$, $V_1$ is raised. In controlling a discrimination phase $\Phi_1$, $\Phi_1$ is controlled so that discrimination results based on discrimination phases $\Phi_1+\Delta\Phi$ and $\Phi_1-\Delta\Phi$ each become equal to the discrimination result based on the discrimination phase $\Phi_1$. If the discrimination result based on $\Phi_1+\Delta\Phi$ does not agree with the discrimination result based on $\Phi_1$, $\Phi_1$ is delayed, and if the discrimination result based on $\Phi_1-\Delta\Phi$ does not agree with the discrimination result based on $\Phi_1$, $\Phi_1$ is advanced.

23 Claims, 23 Drawing Sheets

Fig.15(a)
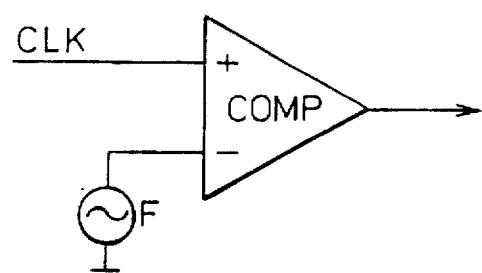
Fig.15(b)
Fig.15(c)
Fig.15(d)
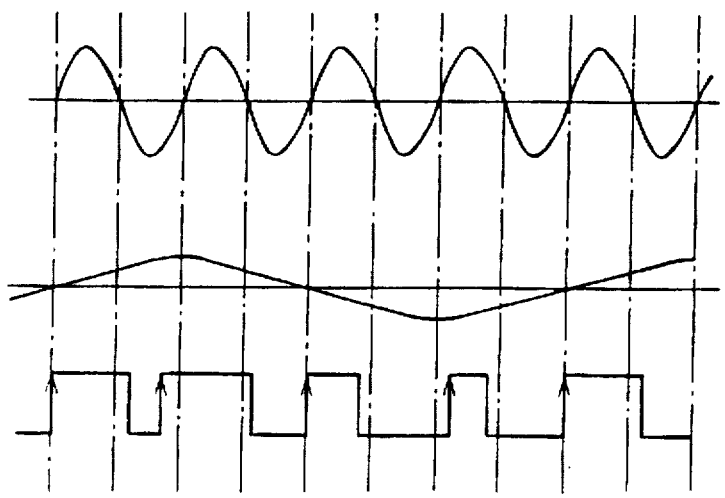

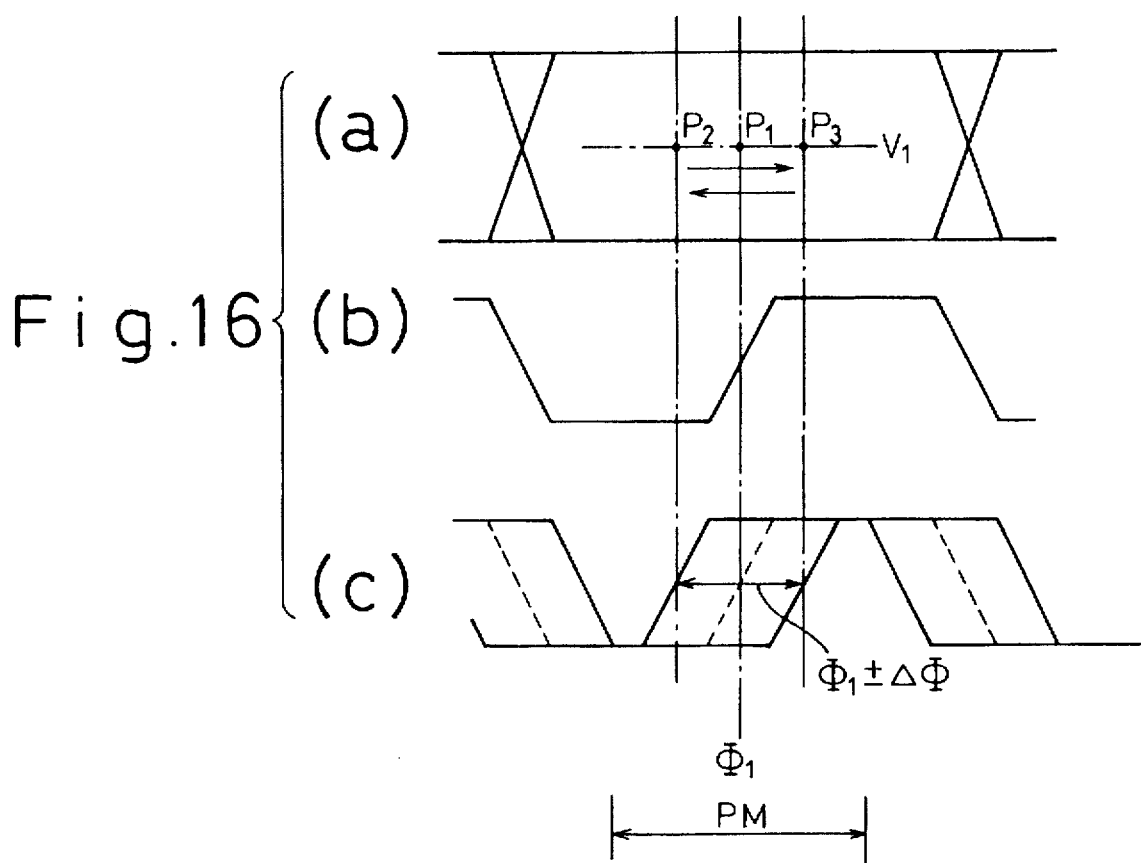

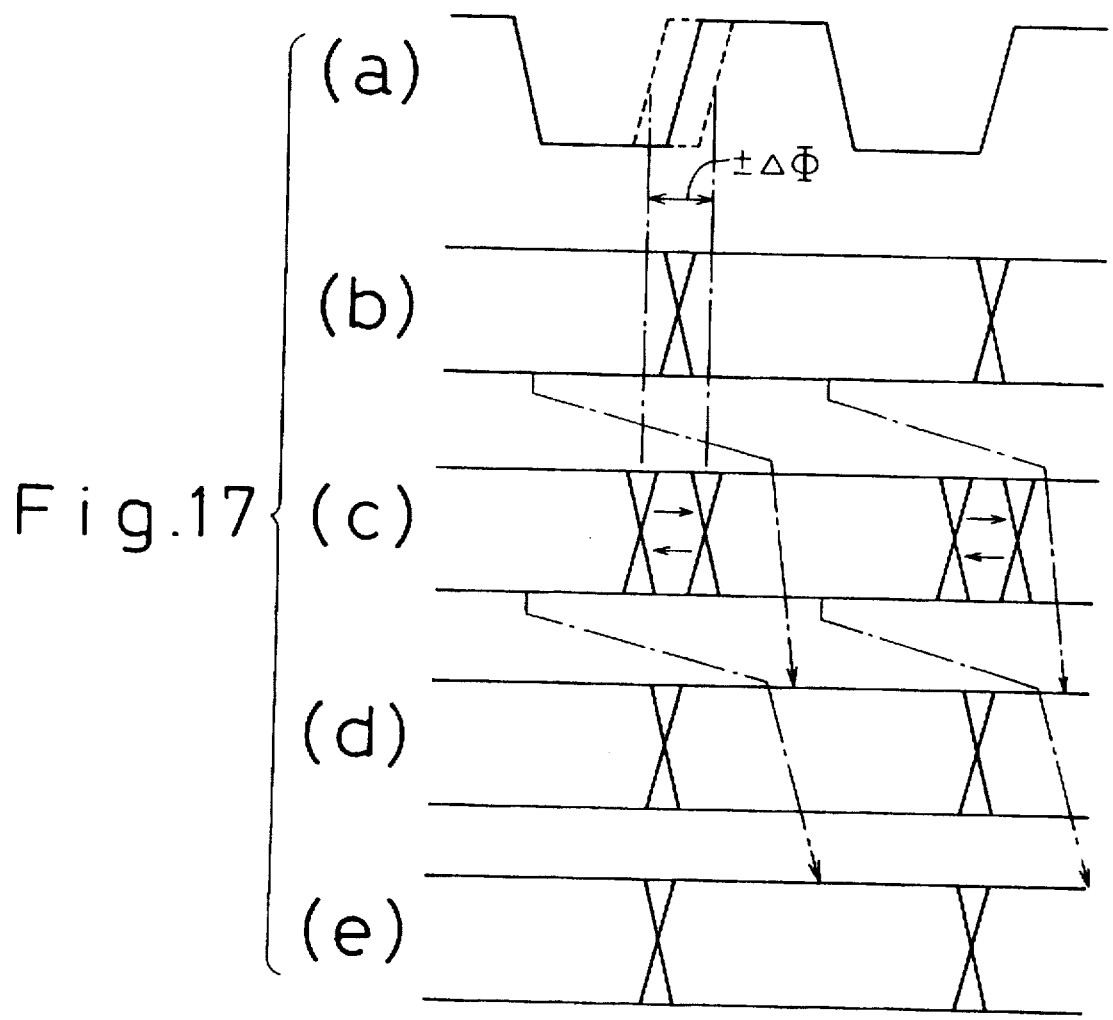

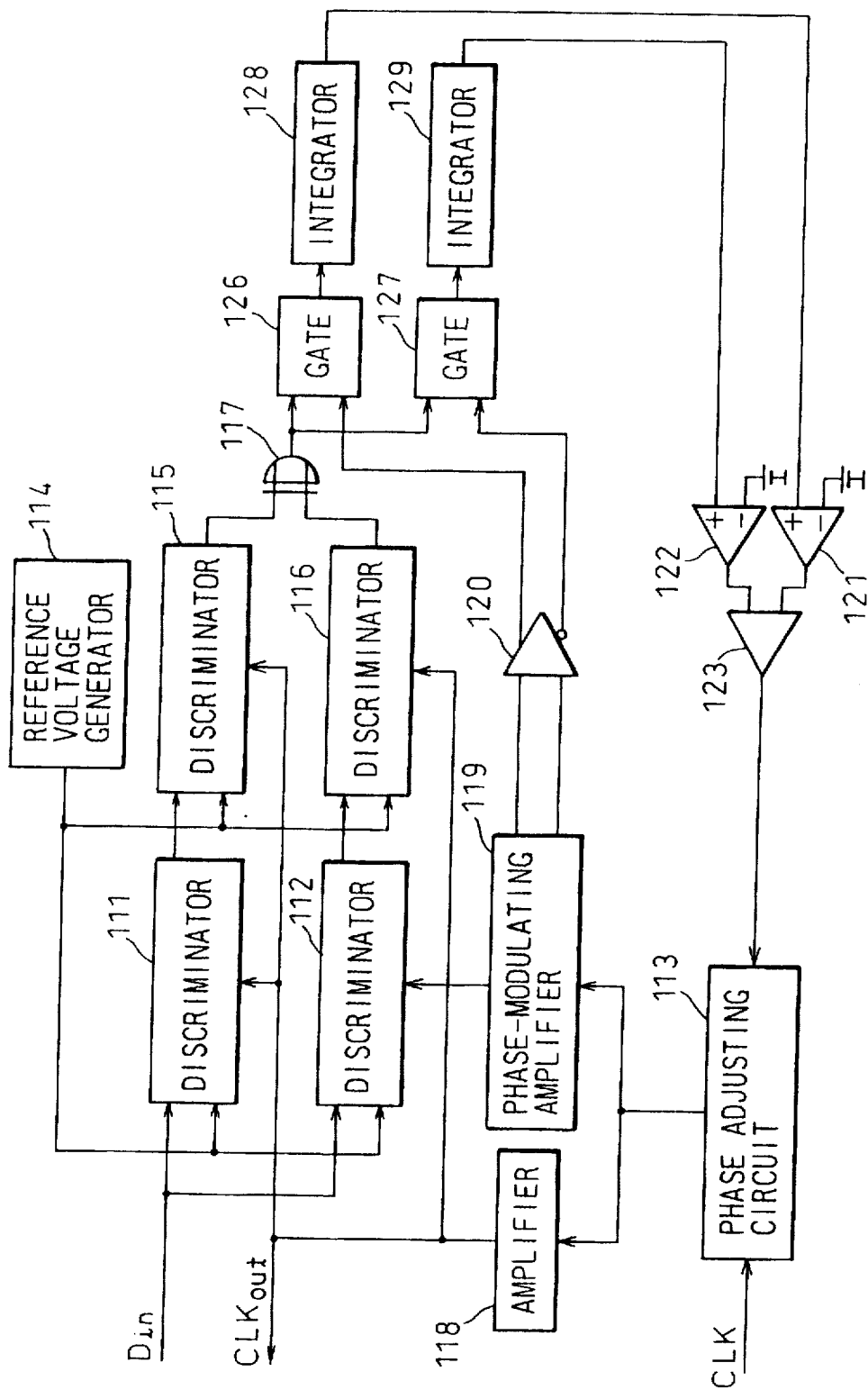

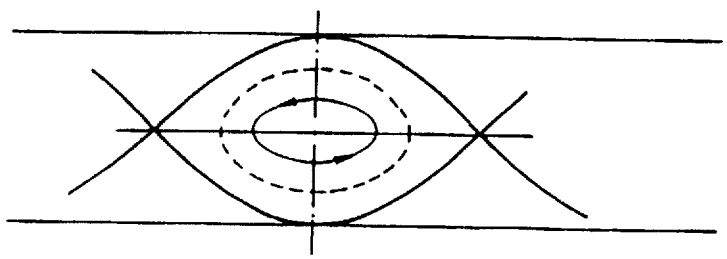
Fig.23(a)
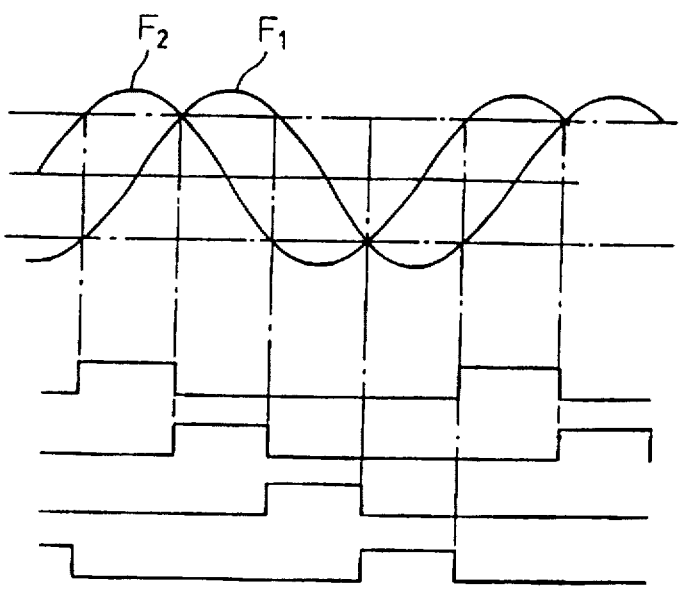
Fig.23(b)
Fig.23(c)
Fig.23(d)
Fig.23(e)
Fig.23(f)

DISCRIMINATION CIRCUIT CAPABLE OF AUTOMATICALLY OPTIMIZING DISCRIMINATION LEVEL AND DISCRIMINATION PHASE

BACKGROUND OF THE INVENTION

1. Field of the Invention

The present invention relates to a discrimination circuit for regenerating digital data carried on a received signal by identifying the level of the received signal by comparing it with a discrimination level with an appropriate discrimination phase, and more particularly to a discrimination circuit capable of automatically optimizing the discrimination level and discrimination phase.

2. Description of the Related Art

An optical receiver for receiving an optical signal intensity-modulated by transmit data comprises: an equalizing amplifier for amplifying and equalizing the received signal in a way that compensates for transmission channel characteristics; a timing regenerator for regenerating from the receiving signal a clock signal that determines the timing of discrimination; and a discrimination circuit for regenerating the data by comparing the level of the received signal with a predetermined discrimination level at the discrimination timing.

In a discrimination circuit of the prior art, a fixed discrimination level is set and a discrimination phase is set based on the phase of the clock signal. In this case, when handling high-speed data of several hundred Mbps or more, there arises the problem that the probability of discrimination error increases, since it is not easy to bring the eye pattern of the amplified/equalized output signal of the equalizing amplifier to an ideal condition.

Furthermore, the configuration of the prior art discrimination circuit has been such that the discrimination level and the discrimination phase are initially set and, when the error rate rises above an allowable level, the initial settings are readjusted. Accordingly, the prior art discrimination circuit, when applied to high-speed data transmission systems, has the problem that not only the adjustment of initial settings is complicated but the adjustment during the operation of the system is difficult.

SUMMARY OF THE INVENTION

It is an object of the present invention to achieve automatic optimization of the discrimination level and discrimination phase, eliminating the need for adjustment work.

According to the present invention, there is provided a discrimination circuit comprising: a first discrimination section for discriminating an input signal by reference to a first discrimination criterion, and thereby regenerating a digital signal as a discrimination result; a second discrimination section for discriminating the input signal by reference to a second discrimination criterion, which is different from the first discrimination criterion and is decided depending on the first discrimination criterion, and for outputting a discrimination result; and a control section for optimizing the first discrimination criterion by varying the first discrimination criterion so that the discrimination result from the first discrimination section becomes equal to the discrimination result from the second discrimination section.

According to the present invention, there is also provided an optical receiver comprising: an optical detector for converting an optical signal into an electrical signal; an equalizing amplifier for amplifying and equalizing an output of the optical detector; a timing regenerator for extracting from an output of the equalizing amplifier a clock signal component contained therein; and a discrimination circuit for discriminating the output of the equalizing amplifier by reference to a discrimination criterion based on the extracted clock signal, and thereby regenerating a digital signal, wherein the discrimination circuit includes a first discrimination section for discriminating an input signal by reference to a first discrimination criterion, and thereby regenerating the digital signal as a discrimination result; a second discrimination section for discriminating the input signal by reference to a second discrimination criterion, which is different from the first discrimination criterion and is decided depending on the first discrimination criterion, and for outputting a discrimination result; and a control section for optimizing the first discrimination criterion by varying the first discrimination criterion so that the discrimination result from the first discrimination section becomes equal to the discrimination result from the second discrimination section.

BRIEF DESCRIPTION OF THE DRAWINGS

FIGS. 15A–15D are diagrams for explaining a phase modulation according to the seventh example of the present invention;

FIGS. 16A–16C are diagrams for explaining the operation of a discrimination circuit according to the seventh example of the present invention;

FIGS. 17A–17E are diagrams for explaining how synchronization is achieved in the discrimination circuit according to the seventh example of the present invention;

FIG. 18 is a block diagram showing an eighth example of the present invention;

FIGS. 23A–23F are diagrams for explaining the operation of a discrimination circuit according to the 11th example of the present invention.

DESCRIPTION OF THE PREFERRED EMBODIMENTS

Figure 1:
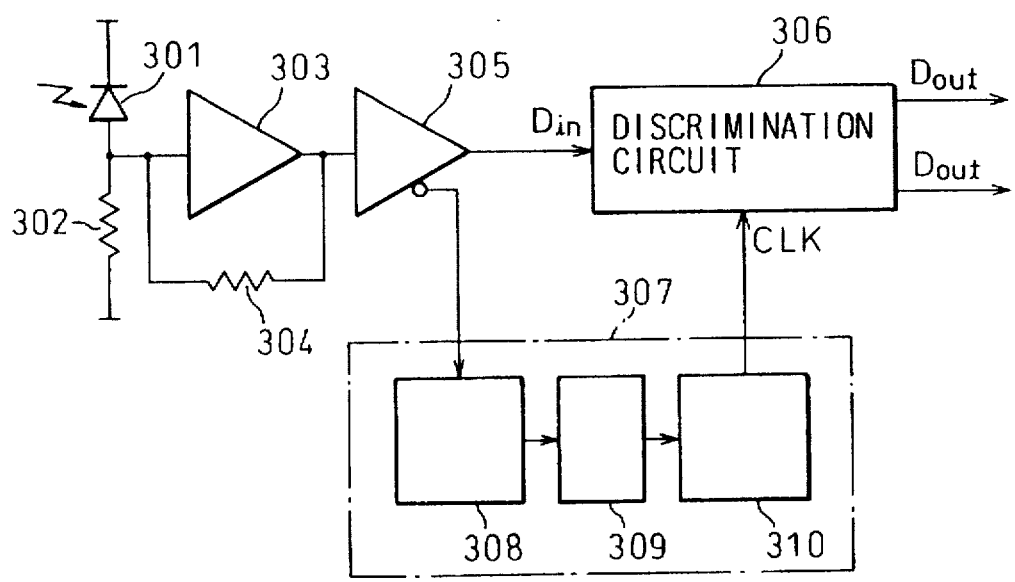
FIG. 1 is a block diagram of an optical receiver according to the present invention.
Figure 2A:
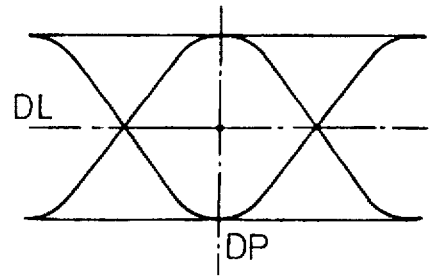
FIGS. 2A–2D are diagrams for explaining a discrimination operation in a discrimination circuit.
Figure 2B:
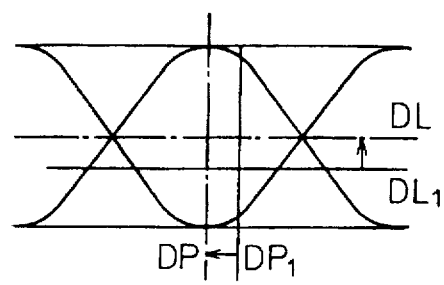
Figure 2C:
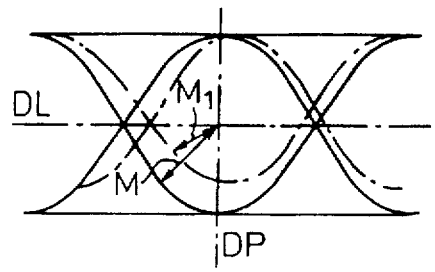
Figure 2D:
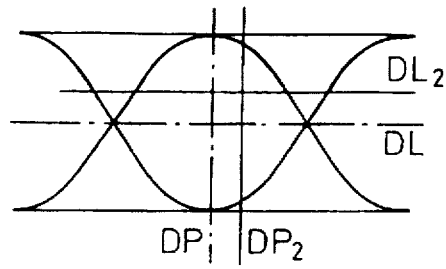

FIG. 1 is a diagram for explaining an outline of an optical receiver according to the present invention, wherein reference numeral 301 is an optical detector such as a pin diode, 302 is an output resistor, 303 is a preamplifier, 304 is a resistor, 305 is an equalizing amplifier, 306 is a discrimination circuit, 307 is a timing regenerator, 308 is a differential extractor, 309 is a filter such as a surface-acoustic-wave filter, and 310 is an amplifier.

An optical signal, intensity-modulated by transmit data and transmitted through a fiber-optic transmission channel, is input to the optical detector 301 for conversion into an electrical signal which is amplified by the preamplifier 303 and then amplified and equalized by the equalizing amplifier 305 in a way that compensates for the transmission channel characteristics; the amplified/equalized output signal is applied as input data $D_{in}$ to the discrimination circuit 306. The amplified/equalized output signal is also applied to the timing regenerator 307, where it is differentiated by the differential extractor 308, a clock component is extracted by the filter 309 whose center frequency is set at the clock frequency, and the extracted clock component is amplified by the amplifier 310 to generate a clock signal CLK.

The discrimination circuit 306 compares the input data $D_{in}$ with a discrimination level with the timing synchronized to the input clock signal CLK, generates "1" data when the level of the input data $D_{in}$ is above the discrimination level or "0" data when it is below the discrimination level, and supplies the resulting output data $D_{out}$ as well as the output clock signal CLK designated as $CLK_{out}$ to circuits at the subsequent stage.

FIG. 2 is a diagram for explaining the discrimination operation. Part (A) shows the ideal condition where the discrimination level DL and discrimination phase DP are set so that the discrimination point coincides with the center point of an eye pattern indicated by a black dot. Part (B) shows the condition where the positions of the discrimination level DL and discrimination phase DP, on the eye pattern, are shifted to positions indicated by $DL_1$ and $DP_1$ due to a DC offset of the input data $D_{in}$, or a change in the phase of the clock signal CLK from the timing regenerator 307. In this condition, the error rate will increase unless the discrimination level $DL_1$ and discrimination phase $DP_1$ are corrected in the directions shown by the arrows.

Part (C) shows the condition where the discrimination level DL and discrimination phase DP are the same as those shown in part (A), but the eye pattern, indicated by the solid lines, has been shifted as shown by the semi-dashed lines, due to increased waveform distortion. In this case, when the margin in the solid-line eye pattern is denoted by M, the margin in the semi-dashed-line eye pattern is reduced to $M_1$, which increases the error rate. Part (D) shows the condition where the discrimination level DL and discrimination phase DP are shifted to $DL_2$ and $DP_2$, respectively, due to temperature variations, aging, variations in supply voltage, etc. In this case also, the error rate will increase unless the discrimination level $DL_2$ and discrimination phase $DP_2$ are corrected accordingly. The error rate also rises due to various kinds of noise (noise caused by spontaneous emission, stimulated Brillouin scattering, self-phase modulation, etc.) resulting from the operation of the optical amplifier.

Figure 3:
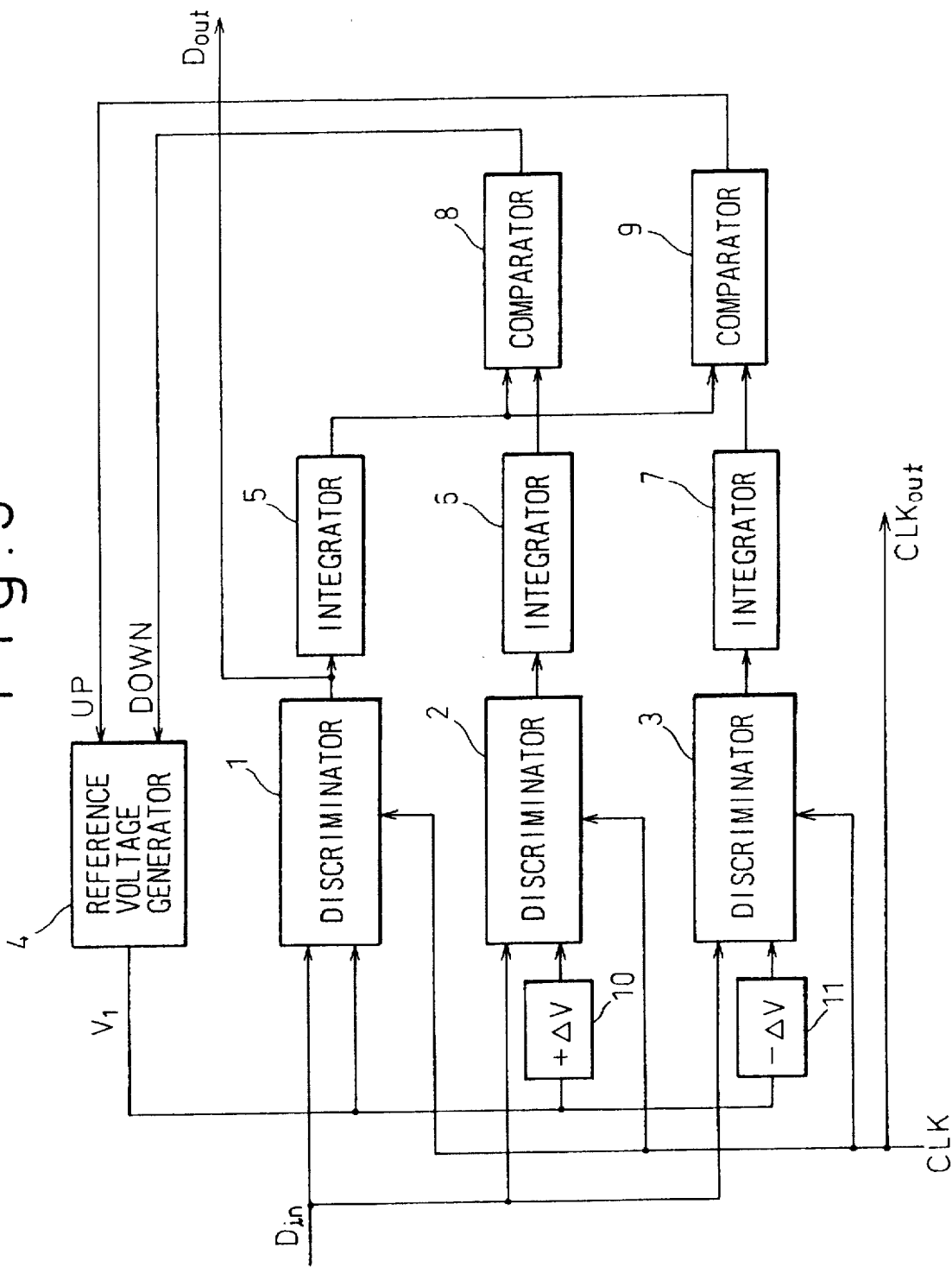
FIG. 3 is a block diagram showing a first example of the present invention.

FIG. 3 is a block diagram showing a first example of the discrimination circuit 306 of FIG. 1. In the figure, reference numerals 1 to 3 are first to third discriminators, 4 is a reference voltage generator, 5 to 7 are integrators, 8 and 9 are comparators, and 10 and 11 are voltage adders. The reference voltage generator 4 outputs a reference voltage $V_1$ which is applied as a discrimination level to the first discriminator 1. The reference voltage $V_1$ is also supplied to the voltage adder 10 where $\Delta V$ is added to it, and the result, $V_1+\Delta V$, is applied as a discrimination level to the second discriminator 2. Furthermore, the reference voltage $V_1$ is supplied to the voltage adder 11 where $\Delta V$ is subtracted from it, and the result, $V_1-\Delta V$, is applied as a discrimination level to the third discriminator 3. Alternatively, the reference voltage generator 4 may be configured to directly output the voltages $V_1$, $V_1+\Delta V$, and $V_1-\Delta V$. The integrators, 5 to 7, and the comparators, 8 and 9, together constitute a control circuit.

The input data $D_{in}$ (received signal) from the equalizing amplifier 305 (FIG. 1) is applied to the first to third discriminators 1 to 3, which are also supplied with the clock signal CLK from the timing regenerator 307 (FIG. 1). The clock signal CLK is output as the clock signal $CLK_{out}$ for circuits at the subsequent stage. With the clock signal CLK providing a discrimination phase, the first discriminator 1 compares the input data $D_{in}$ with the reference voltage $V_1$ as the first discrimination level, and produces output data $D_{out}$. The output data $D_{out}$ is also fed to the integrator 5 for integration. The second discriminator 2 compares the input data $D_{in}$ with $V_1+\Delta V$ as the second discrimination level, and produces an output which is integrated by the integrator 6. The third discriminator 3 compares the input data $D_{in}$ with $V_1-\Delta V$ as the third discrimination level, and produces an output which is integrated by the integrator 7. The integrators 5 to 7 are chosen to have an integration time constant sufficiently longer than the cycle of the input data $D_{in}$ (received signal).

The outputs of the integrators 5 to 7 each represent the average value of the associated discrimination output. The integrators 5 to 7 may each be constructed from a low-pass filter, or from a counter that counts the discrimination output over a predetermined period of time. The comparator 8 compares the average values of the discrimination outputs of the first and second discriminators 1 and 2, while the comparator 9 compares the average values of the discrimination outputs of the first and third discriminators 1 and 3. When both of the comparators 8 and 9 output comparison results indicating that the two average values are substantially equal, it is decided that the discrimination level is optimum, and the reference voltage generator 4 holds the reference voltage $V_1$ at the current level. If the result of the comparison from the comparator 8 indicates a mismatch, it is decided that the discrimination level is too high, and the reference voltage generator 4 lowers the reference voltage $V_1$ in accordance with the result of the comparison. On the other hand, if the result of the comparison from the comparator 9 indicates a mismatch, it is decided that the discrimination level is too low, and the reference voltage generator 4 raises the reference voltage $V_1$ accordingly.

Figure 4A:
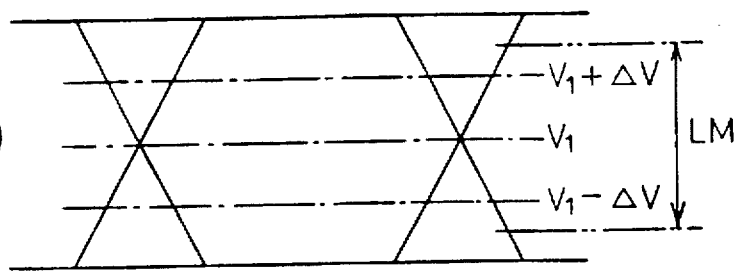
FIGS. 4A–4C are diagrams for explaining the operation of a discrimination circuit according to the first example of the present invention.
Figure 4B:
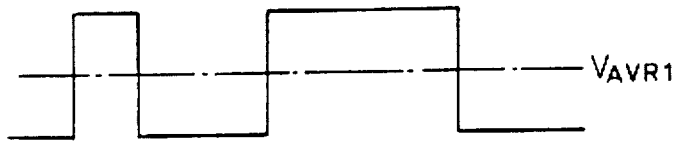
Figure 4C:
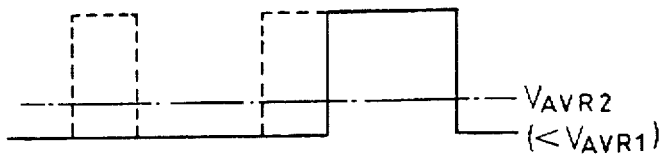

FIG. 4 is a diagram for explaining the operation of the discrimination circuit of FIG. 3. Part (A) shows the discrimination levels on an eye pattern, with the reference voltage $V_1$ set as the first discrimination level, $V_1+\Delta V$ as the second discrimination level, and $V_1-\Delta V$ as the third discrimination level. LM indicates the discrimination level margin.

When the reference voltage $V_1$ is in the center of the eye pattern, and $V_1+\Delta V$ and $V_1-\Delta V$ are both within the range of the discrimination level margin LM, the discrimination output of the received signal, whether based on the second discrimination level of $V_1+\Delta V$ or the third discrimination level of $V_1-\Delta V$, is equal to the discrimination output based on the first discrimination level of $V_1$, and therefore, their average values are equal. On the other hand, when the reference voltage $V_1$ rises relative to the center of the eye pattern, and $V_1+\Delta V$ is moved outside the range of the discrimination level margin LM, the discrimination output of the received signal based on $V_1+\Delta V$ tends to become different from the discrimination output of the received signal based on $V_1$ or $V_1-\Delta V$. Conversely, when the reference voltage $V_1$ lowers relative to the center of the eye pattern, and $V_1-\Delta V$ is moved outside the range of the discrimination level margin LM, the discrimination output of the received signal based on $V_1-\Delta V$ tends to become different from the discrimination output of the received signal based on $V_1$ or $V_1+\Delta V$.

For example, when the discrimination output of the received signal based on the optimum discrimination level is as shown in (B), its average value is $V_{AVR1}$. If the discrimination level rises above the upper limit of the discrimination level margin, the received signal, if at the same level, tends to be misinterpreted as "0", producing a discrimination output such as the one shown in (C). In that case, the average value is $V_{AVR2}$, the relation being $V_{AVR2} < V_{AVR1}$. The mismatch between the two can be detected by the comparators 8 and 9.

From such a relation, when the average value of the discrimination output of the first discriminator 1 is equal to the average value of the discrimination output of the second discriminator 2, but is different from the average value of the discrimination output of the third discriminator 3, the situation is interpreted to represent the condition in which the reference voltage $V_1$ has been lowered relative to the center of the eye pattern. In this case, the reference voltage generator 4 raises the reference voltage $V_t$ in accordance with the output signal of the comparator 9 indicating a mismatch between the average values. On the other hand, when the average value of the discrimination output of the first discriminator 1 is different from the average value of the discrimination output of the second discriminator 2, the situation is interpreted to represent the condition in which the reference voltage $V_1$ has risen relative to the center of the eye pattern. In this case, the reference voltage generator 4 lowers the reference voltage $V_t$ in accordance with the output signal of the comparator 8 indicating a mismatch between the average values. The discrimination level can thus be optimized automatically.

Figure 5:
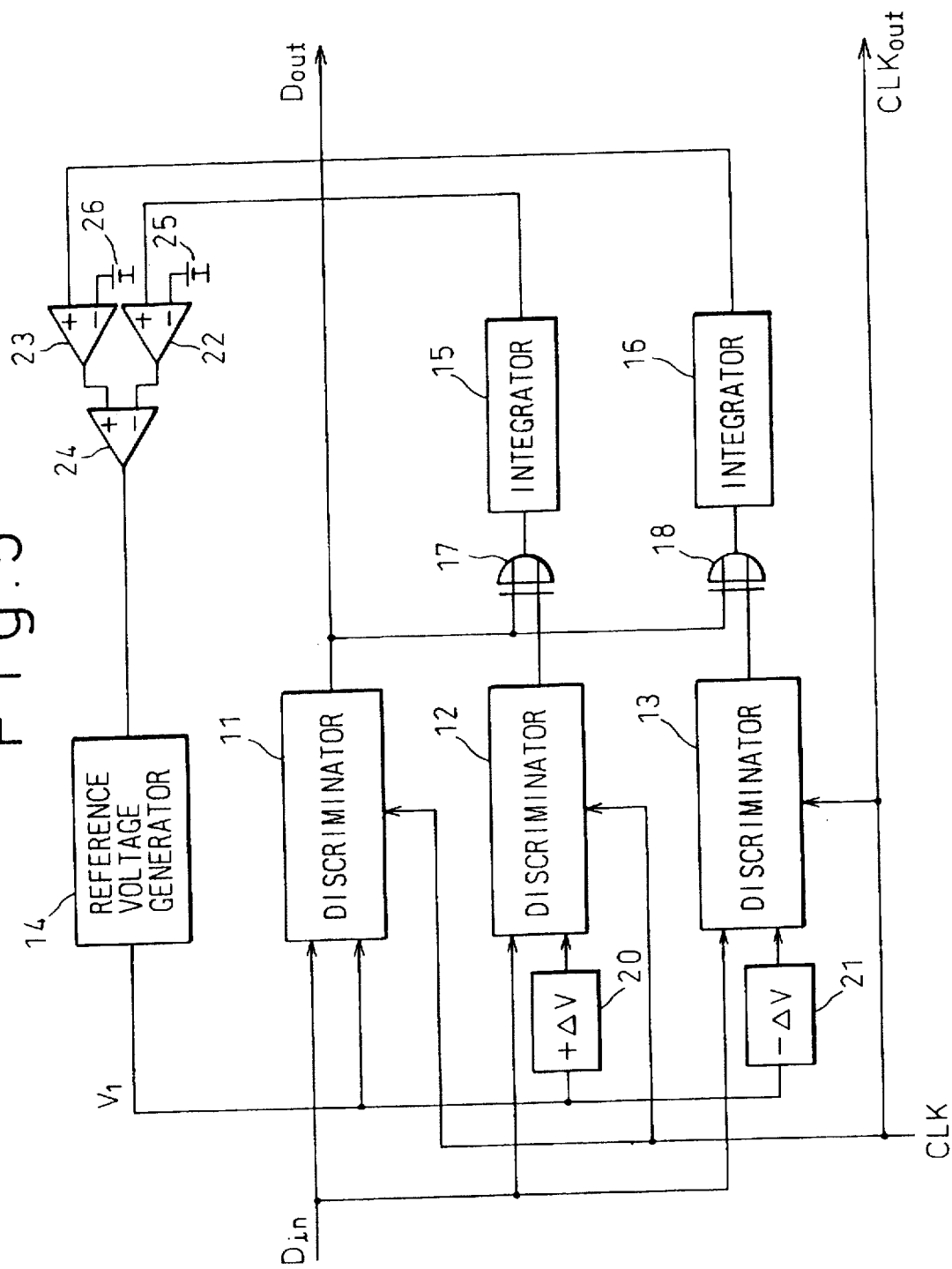
FIG. 5 is a block diagram showing a second example of the present invention.

FIG. 5 is a block diagram showing a second example of the discrimination circuit of FIG. 1. In the figure, reference numerals 11 to 13 are first to third discriminators, 14 is a reference voltage generator, 15 and 16 are integrators, 17 and 18 are exclusive-OR circuits, 20 and 21 are voltage adders, 22 and 23 are comparators or subtractors, 24 is a differential amplifier, and 25 and 26 are reference voltage sources. The integrators 15 and 16, the exclusive-OR circuits 17 and 18, the comparators 22 and 23, and the differential amplifier 24, together constitute a control circuit.

The first to third discriminators 11 to 13, the reference voltage generator 14 for generating the reference voltage $V_1$, and the voltage adders 20 and 21 for adding and subtracting $\Delta V$ to and from the reference voltage $V_1$ are identical in configuration and operation to the first to third discriminators 1 to 3, the reference voltage generator 4, and the voltage adders 10 and 11, respectively; therefore, an explanation will not be repeated here.

The exclusive-OR circuit 17 compares the discrimination outputs between the first discriminator 11 and the second discriminator 12, and when they do not agree, outputs an error pulse which is applied to the integrator 15 for integration. Likewise, the exclusive-OR circuit 18 compares the discrimination outputs between the first discriminator 11 and the third discriminator 13, and when they do not agree, outputs an error pulse which is applied to the integrator 16 for integration. The outputs of the integrators 15 and 16 are supplied as inputs to the respective comparators 22 and 23 for comparison with the voltage from the reference voltage sources 25 and 26; when, in either comparator, the voltage at one input is greater than the reference voltage at the other input, the difference voltage is output through the differential amplifier 24 and applied as a control signal to the reference voltage generator 14.

Figure 6:
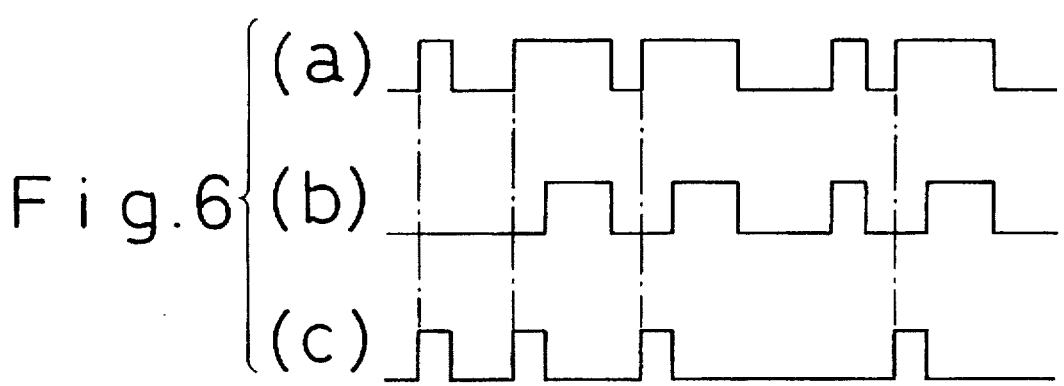
FIGS. 6A–6C are diagrams for explaining the operation of a discrimination circuit according to the second example of the present invention.

FIG. 6 is a diagram for explaining the operation of the discrimination circuit of FIG. 5. If (a) represents the discrimination output of the first discriminator 11, and (b) the discrimination output of the second or third discriminator 12 or 13, the output of the exclusive-OR circuit 17 or 18 will be as shown in (c). The error pulses shown in (c) are integrated by the integrator 15 or 16 to obtain the average value of the exclusive-OR output.

For example, when the reference voltage $V_1$ has risen relative to the center of the eye pattern, the probability of the discrimination output of the second discriminator 12 becoming different from that of the first discriminator 11 increases, but the probability of the discrimination output of the third discriminator 13 becoming different from it is almost zero. As a result, the output of the integrator 15 increases, and when it exceeds the voltage from the reference voltage source 25, the output of the comparator 22 is applied to the negative input terminal of the differential amplifier 24, which then outputs a signal of negative polarity. Supplied with this negative signal, the reference voltage generator 14 lowers the reference voltage $V_1$.

Conversely, when the reference voltage $V_1$ has been lowered relative to the center of the eye pattern, the probability of the discrimination output of the second discriminator 12 becoming different from that of the first discriminator 11 is almost zero, but the probability of the discrimination output of the third discriminator 13 becoming different from it increases. As a result, the output of the integrator 16 increases, and when it exceeds the voltage from the reference voltage source 26, the output of the comparator 23 is applied to the positive input terminal of the differential amplifier 24, which then outputs a signal of positive polarity. Supplied with this positive signal, the reference voltage generator 14 raises the reference voltage $V_1$. In this way, the discrimination level is automatically optimized.

Figure 7:
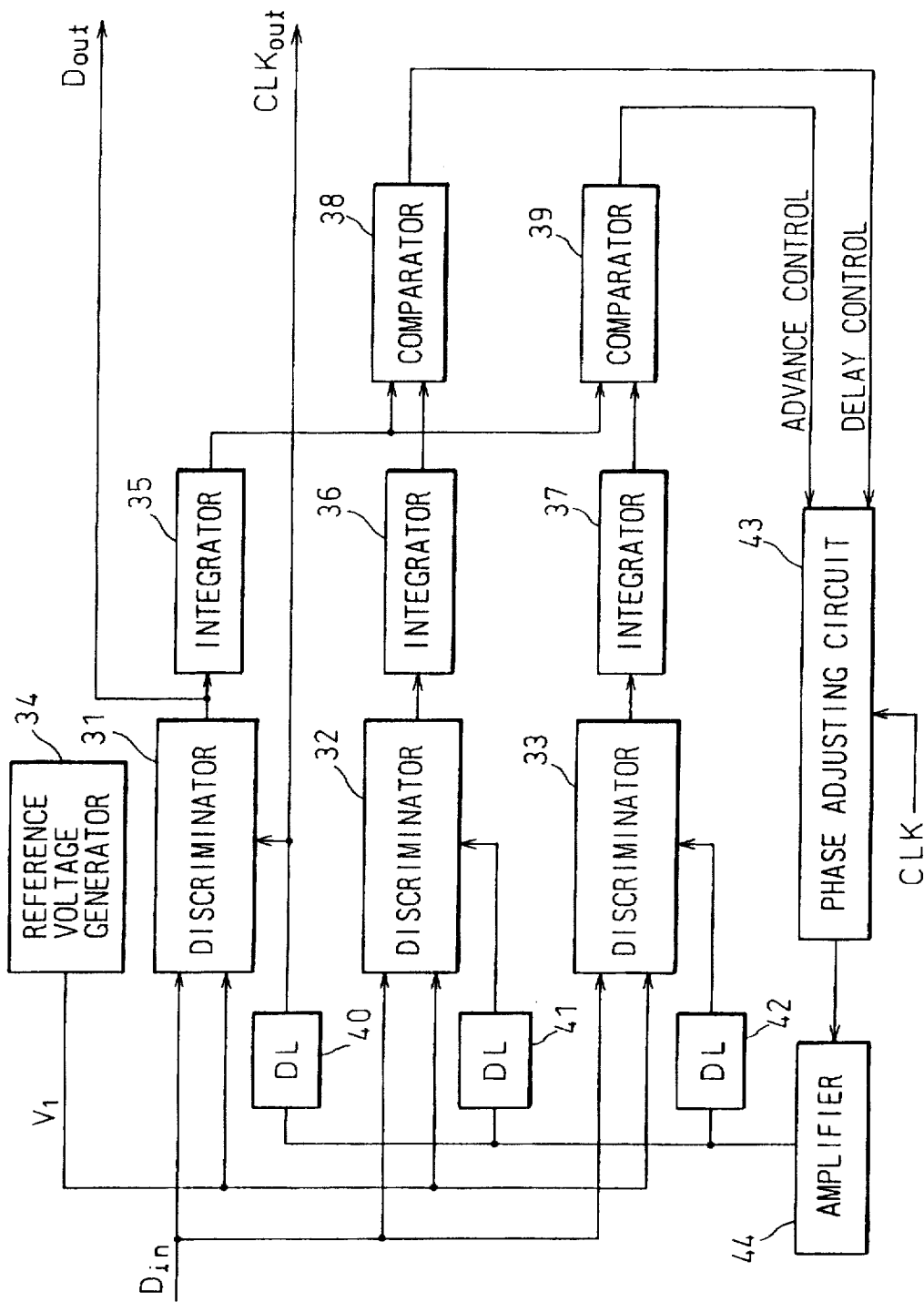
FIG. 7 is a block diagram showing a third example of the present invention.

FIG. 7 is a block diagram showing a third example of the discrimination circuit 306 of FIG. 1. In the figure, reference numerals 31 to 33 are discriminators with reference phase, advanced phase, and delayed phase, respectively, 34 is a reference voltage generator, 35 to 37 are integrators, 38 and 39 are comparators, 40 to 42 are delay circuits (DL), 43 is a phase adjusting circuit, and 44 is an amplifier. The integrators, 35 to 37, and the comparators, 38 and 39, together constitute a control circuit for controlling the phase adjusting circuit 43. The input data $D_{in}$ (received signal) from the equalizing amplifier 305 (FIG. 1) at the previous stage is applied to the reference-phase, advanced-phase, and delayed-phase discriminators 31 to 33, which are also supplied with the clock signal CLK from the timing regenerator 307 (FIG. 1) via the phase adjusting circuit 43, the amplifier 44, and through the respective delay circuits 40 to 42. The clock signal CLK applied to the reference-phase discriminator 31 is output as the clock signal $CLK_{out}$ for circuits at the subsequent stage. Also, the discrimination output of the reference-phase discriminator 31 provides the output data $D_{out}$.

The delay circuits 40 to 42 are respectively constructed to provide delay times so that reference phase $\Phi_1$ is set as the discrimination phase in the reference-phase discriminator 31, $\Phi_1+\Delta\Phi$ is set as the discrimination phase in the advanced-phase discriminator 32, and $\Phi_1-\Delta\Phi$ is set as the discrimination phase in the delayed-phase discriminator 33. The phase difference $\Delta\Phi$ in this case can be chosen appropriately based on the phase margin of the eye pattern. Further, the reference voltage $V_1$ from the reference voltage generator 34 provides the discrimination level for the reference-phase, advanced-phase, and delayed-phase discriminators 31 to 33.

Figure 8:
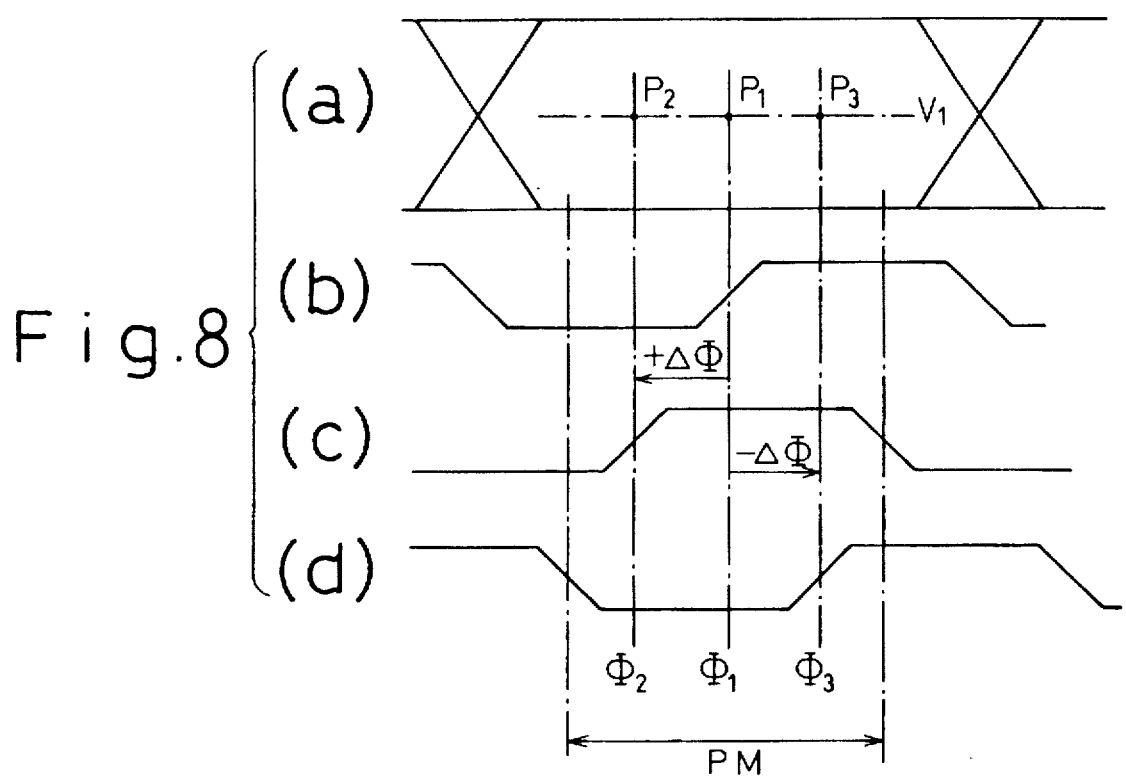
FIGS. 8A–8D are diagrams for explaining the operation of a discrimination circuit according to the third example of the present invention.

FIG. 8 is a diagram for explaining the operation of the discrimination circuit of FIG. 7. Part (a) shows an eye pattern, (b) the clock signal applied to the reference-phase discriminator 31, (c) the clock signal applied to the advanced-phase discriminator 32, and (d) the clock signal applied to the delayed-phase discriminator 33. The reference-phase discriminator 31 discriminates the received signal by using the reference voltage $V_1$ as the discrimination level and the reference phase $\Phi_1$ as the discrimination phase. The advanced-phase discriminator 32 discriminates the received signal by using the reference voltage $V_1$ as the discrimination level and $\Phi_1+\Delta\Phi$ as the discrimination phase. The delayed-phase discriminator 33 discriminates the received signal by using the reference voltage $V_1$ as the discrimination level and $\Phi_1-\Delta\Phi$ as the discrimination phase. The discrimination points are therefore $P_1$, $P_2$, and $P_3$, respectively. In this instance, $\Phi_1\pm\Delta\Phi$ is chosen to fall within the range of the discrimination phase margin.

When the reference phase $\Phi_1$ is advanced in phase due to temperature variations of the timing regenerator, for example, the error rate increases in the advanced-phase discriminator 32 in discriminating the received signal by reference to the discrimination phase of $\Phi_1+\Delta\Phi$. On the other hand, in the delayed-phase discriminator 33 which discriminates the received signal by reference to the discrimination phase of $\Phi_1-\Delta\Phi$, the error rate is approximately the same as the error rate in the reference-phase discriminator 31 which discriminates the received signal by reference to the reference phase $\Phi_1$. As a result, the integration outputs of the integrators 35 and 37 are approximately equal, but the integration outputs of the integrators 35 and 36 are different from each other, so that an output signal of the comparator 38 is applied to the phase adjusting circuit 43 which then performs phase delaying control to bring the reference phase $\Phi_1$ back to the center of the eye pattern.

Conversely, when the reference phase $\Phi_1$ is delayed in phase with respect to the center of the eye pattern, the error rate increases in the delayed-phase discriminator 33 in discriminating the received signal by reference to the discrimination phase of $\Phi_1-\Delta\Phi$. In this case, the integration outputs of the integrators 35 and 36 are approximately equal, but the integration outputs of the integrators 35 and 37 are different from each other. As a result, an output signal of the comparator 39 is applied to the phase adjusting circuit 43 which then performs phase advancing control to bring the reference phase $\Phi_1$ back to the center of the eye pattern. The discrimination phase can thus be optimized automatically.

Figure 9:
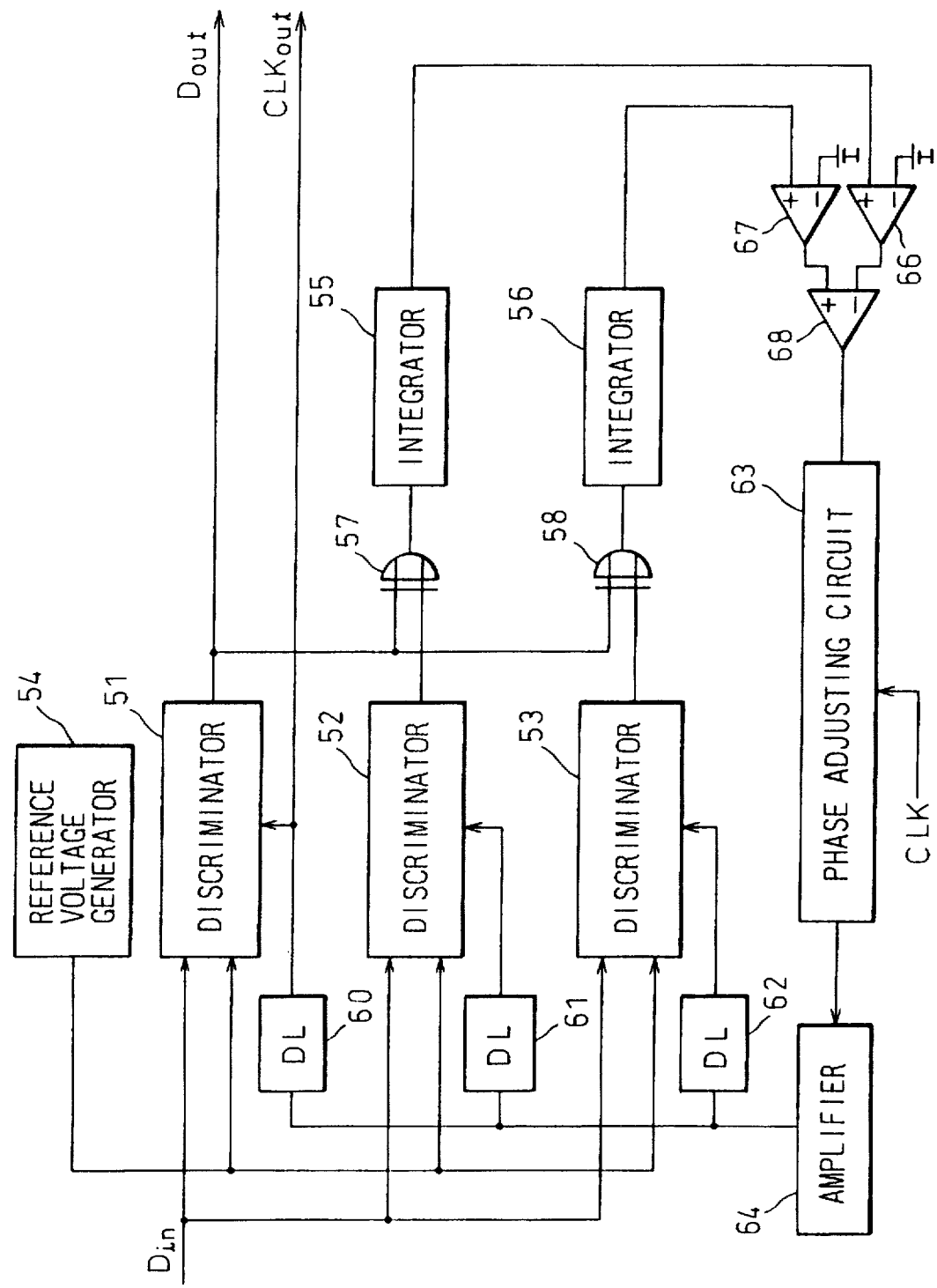
FIG. 9 is a block diagram showing a fourth example of the present invention.

FIG. 9 is a block diagram showing a fourth example of the discrimination circuit 306 of FIG. 1. In the figure, reference numerals 51 to 53 are discriminators with reference phase, advanced phase, and delayed phase, respectively, 54 is a reference voltage generator, 55 and 56 are integrators, 57 and 58 are exclusive-OR circuits, 60 to 62 are delay circuits (DL), 63 is a phase adjusting circuit, 64 is an amplifier, 66 and 67 are comparators, and 68 is a differential amplifier. The integrators 55 and 56, the exclusive-OR circuits 57 and 58, the comparators 66 and 67, and differential amplifier 68, together constitute a control circuit for controlling the phase adjusting circuit 63. The input data $D_{in}$ (received signal) from the equalizing amplifier 305 (FIG. 1) at the previous stage is applied to the reference-phase, advanced-phase, and delayed-phase discriminators 51 to 53, which are also supplied with the clock signal CLK from the timing regenerator 307 (FIG. 1) via the phase adjusting circuit 63, the amplifier 64, and through the respective delay circuits 60 to 62. The clock signal CLK applied to the reference-phase discriminator 51 is output as the clock signal $CLK_{out}$ for circuits at the subsequent stage. Also, the discrimination output of the reference-phase discriminator 51 provides the output data $D_{out}$.

When the reference phase $\Phi_1$ is advanced in phase with respect to the center of the eye pattern, for example, the discrimination output of the reference-phase discriminator 51 becomes approximately equal to that of the delayed-phase discriminator 53, as in the foregoing example; as a result, the exclusive-OR circuit 58 successively outputs 0s most of the time. However, the discrimination output of the reference-phase discriminator 51 tends to become different from that of the advanced-phase discriminator 52, and as a result, the exclusive-OR circuit 57 outputs a signal of logical 1. Accordingly, the integration output of the integrator 55 increases, and when it exceeds the reference voltage being input to the comparator 66, the output signal of the comparator 66 is applied to the negative input terminal of the differential amplifier 68, which outputs a signal of negative polarity. Supplied with this negative signal, the phase adjusting circuit 63 performs phase delaying control to bring the reference phase $\Phi_1$ back to the center of the eye pattern.

Conversely, when the reference phase $\Phi_1$ is delayed in phase with respect to the center of the eye pattern, the discrimination output of the reference-phase discriminator 51 becomes approximately equal to that of the advanced-phase discriminator 52, but the probability of the discrimination output of the reference-phase discriminator 51 becoming different from that of the delayed-phase discriminator 53 increases. Accordingly, the integration output of the integrator 56 increases, and when it exceeds the reference voltage being input to the comparator 67, the output signal of the comparator 67 is applied to the positive input terminal of the differential amplifier 68, which outputs a signal of positive polarity. Supplied with this positive signal, the phase adjusting circuit 63 performs phase advancing control to bring the reference phase $\Phi_1$ back to the center of the eye pattern. The discrimination phase can thus be optimized automatically.

Figure 10:
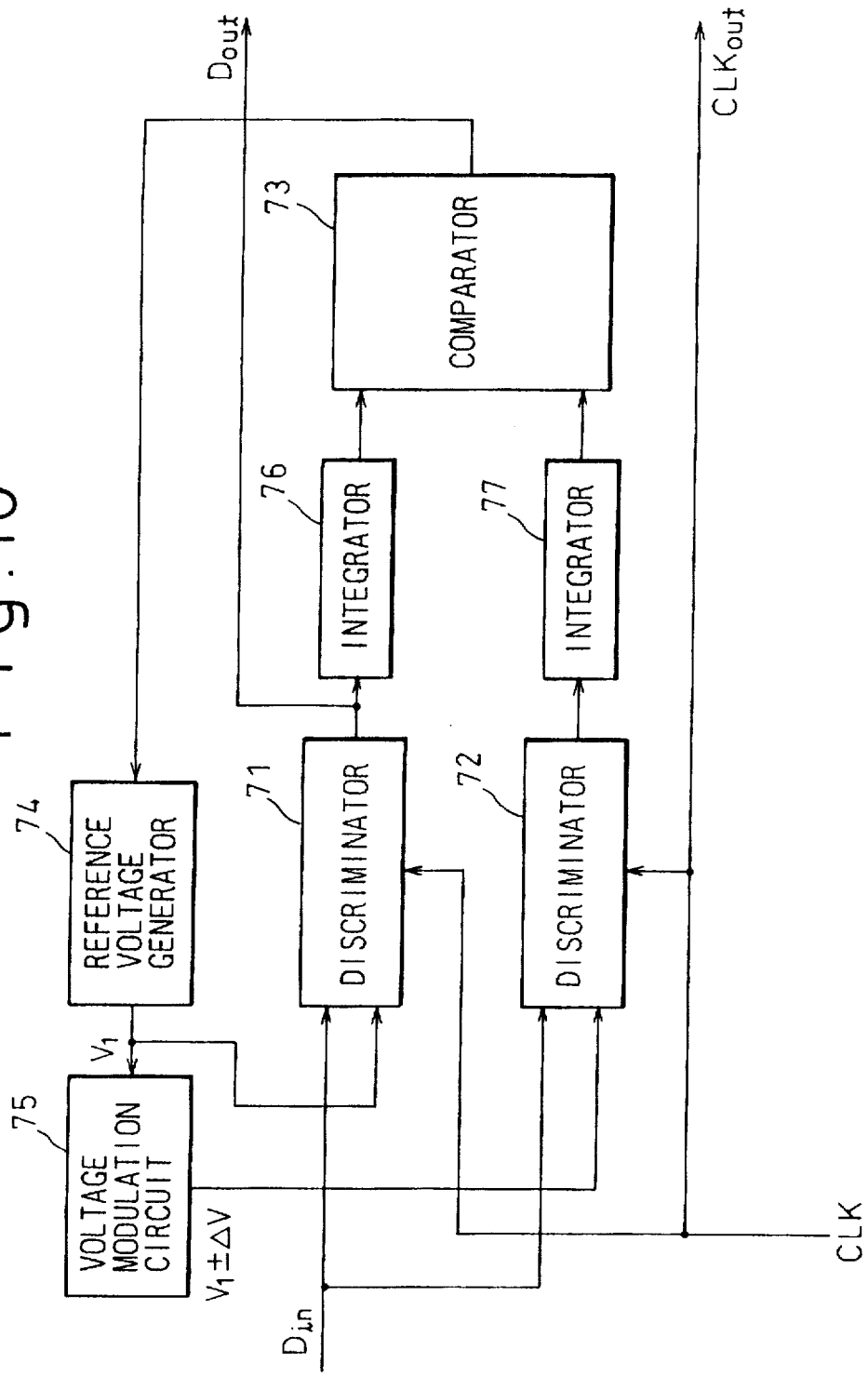
FIG. 10 is a block diagram showing a fifth example of the present invention.

FIG. 10 is a block diagram showing a fifth example of the discrimination circuit of FIG. 1. In the figure, reference numerals 71 and 72 are first and second discriminators, 73 is a comparator or a subtractor, 74 is a reference voltage generator, 75 is a voltage modulation circuit, and 76 and 77 are integrators. The integrators 76 and 77 and the comparator 73 together constitute a control circuit for controlling the reference voltage generator 74. The input data $D_{in}$ (received signal) from the equalizing amplifier 305 at the previous stage is supplied to the first and second discriminators 71 and 72, which are also supplied with the clock signal CLK from the timing regenerator 307 (FIG. 1).

The reference voltage $V_1$ from the reference voltage generator 74 is supplied as the discrimination level to the first discriminator 71. The reference voltage $V_1$ is also supplied to the voltage modulation circuit 75, which voltage-modulates it with a sine wave varying at a speed sufficiently slower than the speed of the input data $D_{in}$, and supplies the resulting voltages, $V_1 \pm \Delta V$, as discrimination levels to the second discriminator 72. The discrimination output of the first discriminator 71 provides the output data $D_{out}$.

Figure 11A:
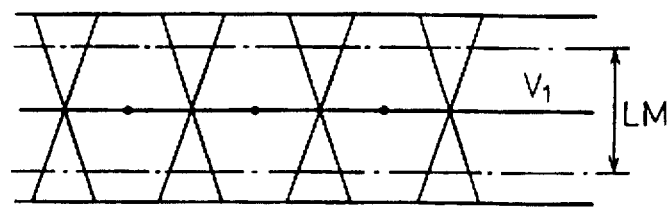
FIGS. 11A–11B are diagrams for explaining the operation of a discrimination circuit according to the fifth example of the present invention.
Figure 11B:
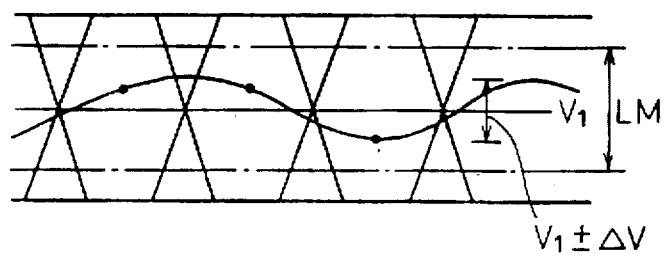

FIG. 11 is a diagram for explaining the operation of the discrimination circuit of FIG. 10. Part (a) shows the discrimination of the received signal in the first discriminator 71 using the discrimination level provided by the reference voltage $V_1$, while (b) shows the discrimination of the received signal in the second discriminator 72 using the voltage-modulated discrimination levels of $V_1 \pm \Delta V$. When the levels of $V_1 \pm \Delta V$ are within the range of the discrimination level margin LM, the discrimination outputs of the first and second discriminators 71 and 72 are approximately equal. Therefore, the integration outputs of the integrators 76 and 77, when compared by the comparator 73, are approximately equal, so that the reference voltage $V_1$ from the reference voltage generator 74 is maintained at the current level.

When the reference voltage $V_1$ rises and $V_1 + \Delta V$ is moved outside the range of the discrimination margin LM, the probability of the second discriminator 72 interpreting the input as "1" decreases, compared to that of the first discriminator 71. This increases the integration output of the integrator 76 with respect to that of the integrator 77. In accordance with the difference between their integration outputs, the comparator 73 controls the reference voltage generator 74 to lower the reference voltage $V_1$.

Conversely, when the reference voltage $V_1$ drops and $V_1 - \Delta V$ is moved outside the range of the discrimination margin LM, the probability of the second discriminator 72 interpreting the input as "0" decreases, compared to that of the first discriminator 71. This decreases the integration output of the integrator 76 with respect to that of the integrator 77. In accordance with the difference between their integration outputs, the comparator 73 controls the reference voltage generator 74 to raise the reference voltage $V_1$. The reference voltage $V_1$ can thus be optimized automatically.

Figure 12:
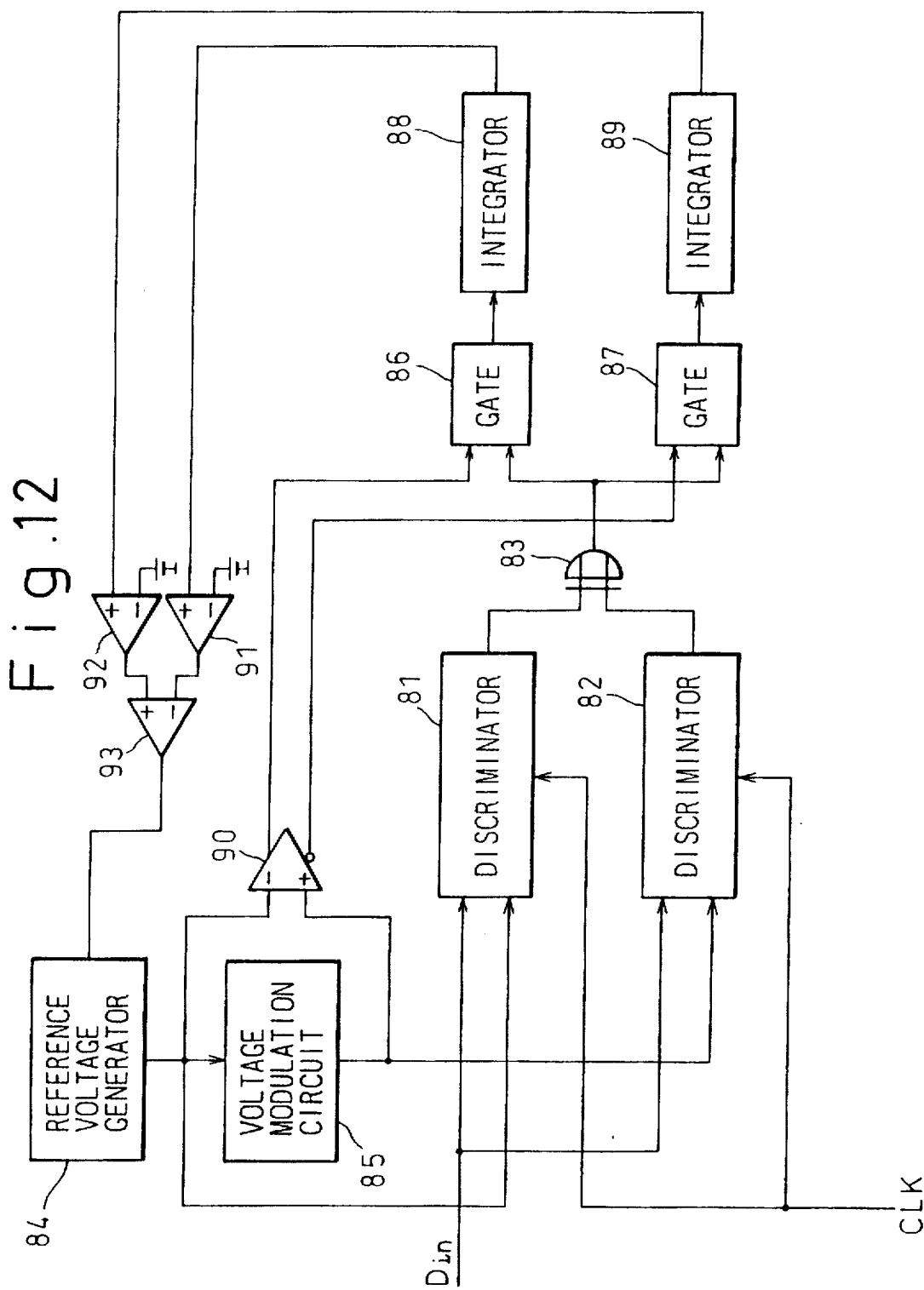
FIG. 12 is a block diagram showing a sixth example of the present invention.

FIG. 12 is a block diagram showing a sixth example of the discrimination circuit of FIG. 1. In the figure, reference numerals 81 and 82 are first and second discriminators, 83 is an exclusive-OR circuit, 84 is a reference voltage generator, 85 is a voltage modulation circuit, 86 and 87 are gate circuits, 88 and 89 are integrators, 90 is a gate control circuit, 91 and 92 are comparators, and 93 is a differential amplifier. The exclusive-OR circuit 83, the gate circuits 86 and 87, the integrators 88 and 89, the comparators 91 and 92, the differential amplifier 93, and the gate control circuit 90, together constitute a control circuit for controlling the reference voltage generator 84.

The input data $D_{in}$ (received signal) from the equalizing amplifier 305 at the previous stage is supplied to the first and second discriminators 81 and 82, which are also supplied with the clock signal CLK from the timing regenerator 307. The reference voltage $V_1$ from the reference voltage generator 84 is supplied as the discrimination level to the first discriminator 81. The reference voltage $V_1$ is also supplied to the voltage modulation circuit 85 which voltage-modulates it at a speed sufficiently lower than the speed of the input data and supplies the resulting voltages, $V_1 \pm \Delta V$, as discrimination levels to the second discriminator 82.

As in the foregoing example, the first discriminator 81 discriminates the input data $D_{in}$ by using the reference voltage $V_1$ as the discrimination level and the phase of the clock signal CLK as the discrimination phase, while the second discriminator 82 discriminates the input data $D_{in}$ by using $V_1 \pm \Delta V$ as the discrimination level and the phase of the clock signal CLK as the discrimination phase. When the reference voltage $V_1$ is near the center of the eye pattern, the discrimination outputs of the first and second discriminators 81 and 82 are equal, so that the exclusive-OR circuit 83 outputs a 0.

The gate control circuit 90 is constructed from a comparator having complementary outputs, which compares the reference voltage $V_1$ with a voltage-modulated version of that voltage, $V_M = V_1 \pm \Delta V$, and outputs a gate control signal to open the gate circuit 86 during the period when $V_1 > V_M$ and to open the gate circuit 87 during the period when $V_1 < V_M$, thereby distributing the output of the exclusive-OR circuit 83 between the integrators 88 and 89. Alternatively, the gate control circuit 90 may be configured to generate a gate control signal by using a modulating signal in the voltage modulation circuit 85.

Figure 13:
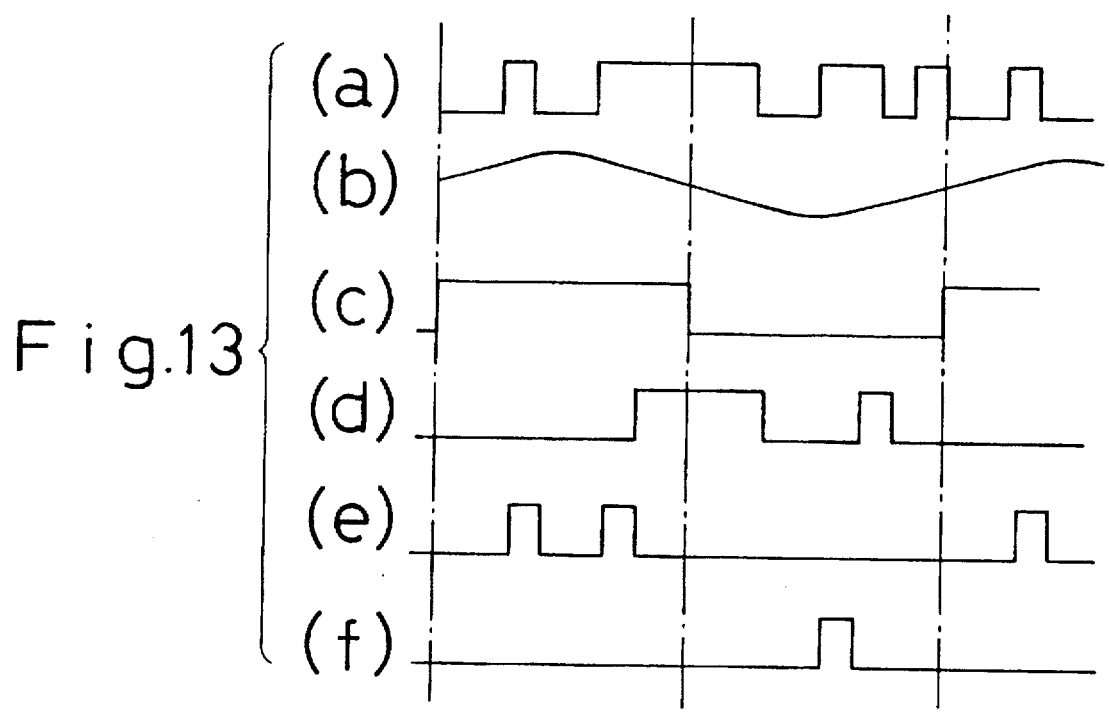
FIGS. 13A–13F are diagrams for explaining the operation of a discrimination circuit according to the sixth example of the present invention.

FIG. 13 is a diagram for explaining the operation of the discrimination circuit of FIG. 12. Part (a) shows an example of the discrimination output of the first discriminator 81 with the reference voltage $V_1$ set as the discrimination level, and (b) shows an example of the modulating signal in the voltage modulation circuit 85. Part (c) shows the gate control signal output from the noninverting terminal after comparing the reference voltage $V_1$ with the voltage-modulated voltage $V_M$, the gate control signal being "1" when the modulating signal is of positive polarity and "0" when it is of negative polarity; and (d) shows an example of the discrimination output of the second discriminator 82 with the voltage-modulated voltage $V_M$ set as the discrimination level.

The exclusive-OR circuit 83 exclusive-ORs the discrimination outputs (a) and (d), and supplies the output shown in (e) to the integrator 88 during the period when the gate control signal (c) is "1" and the output shown in (f) to the integrator 89 during the period when the gate control signal (c) is "0" The integration outputs from the integrators 88 and 89 correspond to the error rates when the discrimination level is at $V_1 + \Delta V$ and $V_1 - \Delta V$, respectively, that is, to the integration outputs of the integrators 15 and 16 shown in FIG. 5. These outputs are supplied as inputs to the comparators 91 and 92 for comparison with the reference voltages; when, in either comparator, the voltage at one input is greater than the reference voltage at the other input, the differential amplifier 93 produces an output of positive polarity or negative polarity and applies it to the reference voltage generator 84, which then performs control to shift the reference voltage $V_1$ toward the center of the eye pattern, thus accomplishing optimization of the reference voltage $V_1$.

Figure 14:
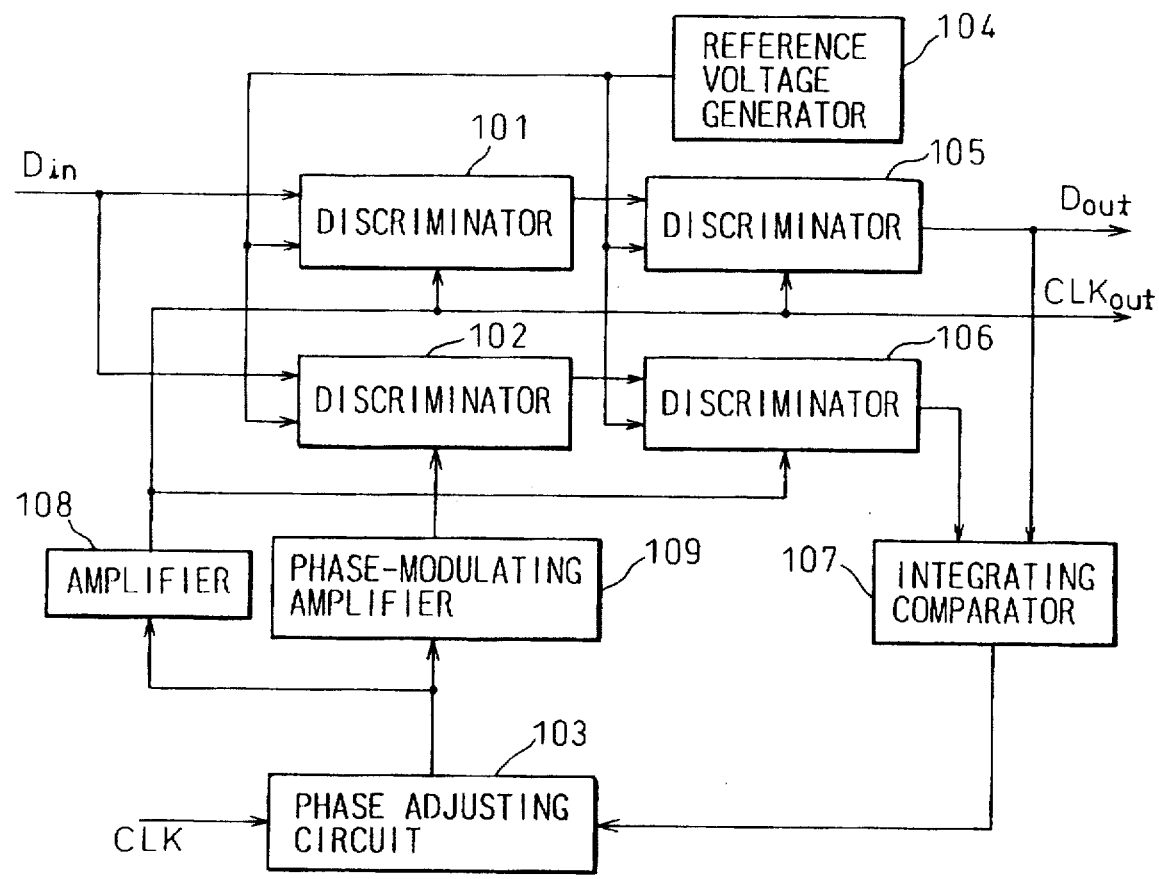
FIG. 14 is a block diagram showing a seventh example of the present invention.

FIG. 14 is a block diagram showing a seventh example of the discrimination circuit of FIG. 1. In the figure, reference numerals 101 and 102 are discriminators with reference phase and modulated phase, respectively, 103 is a phase adjusting circuit, 104 is a reference voltage generator, 105 and 106 are discriminators, 107 is an integrating comparator, 108 is an amplifier, and 109 is a phase-modulating amplifier. The discriminator 101 discriminates the input data $D_{in}$ by using the reference voltage $V_1$, supplied from the reference voltage generator 104, as the discrimination level and the phase of the clock signal, passed through the phase adjusting circuit 103 and the amplifier 108, as the discrimination phase. The discriminator 102 discriminates the input data $D_{in}$ by using the reference voltage $V_1$ as the discrimination level and the phase of the clock signal, passed through the phase adjusting circuit 103 and the phase-modulating amplifier 109, as the discrimination phase.

The phase-modulating amplifier 109 modulates the phase of the clock signal, whose phase has been controlled by the phase adjusting circuit 103, with a sine wave varying at a speed sufficiently slower than the speed of the input data $D_{in}$. As a result, the modulated-phase discriminator 102 performs discrimination using phase-modulated discrimination phases, $\Phi_1 \pm \Delta\Phi$, where $\Phi_1$ is the reference phase. On the other hand, the discriminators 105 and 106 discriminate the discrimination outputs of the reference-phase and modulated-phase discriminators 101 and 102, respectively, by using the reference voltage $V_1$ as the discrimination voltage and the reference phase $\Phi_1$ as the discrimination phase, and may be constructed, for example, from flip-flops. The discrimination outputs of the reference-phase and modulated-phase discriminators 101 and 102 can thus be phase synchronized. Then, the clock signal $CLK_{out}$ of reference phase $\Phi_1$ and the discrimination output of the discriminator 105, as the output data $D_{out}$, are fed to circuits at the subsequent stage.

The outputs of the discriminators 105 and 106 are fed into the integrating comparator 107 which integrates each output and compares one with the other. When the reference phase $\Phi_1$ is near the center of the eye pattern, the discrimination outputs of the first and second discriminators 101 and 102 are equal, but when $\Phi_1+\Delta\Phi$ or $\Phi_1-\Delta\Phi$ is moved outside the range of the discrimination phase margin, the discrimination outputs are different; in that case, the integrating comparator 107 controls the phase adjusting circuit 103 to shift the reference phase $\Phi_1$ toward the center of the eye pattern.

FIG. 15 is a diagram for explaining the phase modulation performed in the discrimination circuit of FIG. 14. Part (a) shows the phase-modulating amplifier 109 constructed from a comparator COMP which compares the clock signal CLK with a modulating signal F; (b) shows an example of the clock signal CLK; (c) shows an example of the modulating signal F; and (d) shows an output signal of the comparator COMP. As shown, the rising phase is modulated, and by using this rising phase as the discrimination phase, the second discriminator 102 discriminates the input data $D_{in}$.

FIG. 16 is a diagram for explaining the operation of the discrimination circuit of FIG. 14. Part (a) shows discrimination points $P_1$, $P_2$, and $P_3$ on the eye pattern; (b) shows the clock signal of reference phase $\Phi_1$; and (c) shows a phase-modulated clock signal. On the eye pattern of (a), the discrimination point by the clock signal of (b) is at $P_1$; on the other hand, the discrimination point by the clock signal of (c) varies from $P_2$ toward $P_3$ or from $P_3$ toward $P_2$ as shown by the double-headed arrow.

When the reference phase $\Phi_1$ is near the center of the eye pattern, the discrimination outputs of the reference-phase and modulated-phase discriminators 101 and 102 are equal, but when the reference phase $\Phi_1$ is advanced or delayed in phase with respect to the center of the eye pattern, the discrimination error rate in the modulated-phase discriminator 102 increases, which causes a difference between the discrimination outputs of the reference-phase and modulated-phase discriminators 101 and 102 when integrated by the integrating comparator 107; in that case, the phase adjusting circuit 103 is controlled to shift the reference phase $\Phi_1$ toward the center of the eye pattern. The reference phase $\Phi_1$ can thus be optimized automatically.

FIG. 17 is a diagram for explaining how synchronization is achieved in the discrimination circuit of FIG. 14. Part (a) shows the clock signal of reference phase $\Phi_1$, (b) the discrimination output of the reference-phase discriminator 101, (c) the discrimination output of the modulated-phase discriminator 102, and (d) and (e) the outputs of the discriminators 105 and 106. As shown, the reference-phase discriminator 101 uses the reference phase $\Phi_1$ as the discrimination phase and produces the discrimination output shown in (b), while the modulated-phase discriminator 102 uses $\Phi_1 \pm \Delta\Phi$ as the discrimination phase and produces a discrimination output with a phase shift of $\pm\Delta\Phi$, as shown in (c).

Then, the discriminators 105 and 106, each constructed from a flip-flop or the like, and supplied with the same clock signal, act to bring the discrimination outputs of the reference-phase discriminator 101 and modulated-phase discriminator 102 into phase synchronization, as shown in (d) and (e), respectively. This serves to increase the accuracy of comparison and integration of the discrimination outputs of the reference-phase discriminator 101 and modulated-phase discriminator 102.

FIG. 18 is a block diagram showing an eighth example of the discrimination circuit of FIG. 1. In the figure, reference numerals 111 and 112 are discriminators with reference phase and modulated phase, respectively, 113 is a phase adjusting circuit, 114 is a reference voltage generator, 115 and 116 are discriminators, 117 is an exclusive-OR circuit, 118 is an amplifier, 119 is a phase-modulating amplifier, 120 is a gate control circuit, 121 and 122 are comparators, 123 is a differential amplifier, 126 and 127 are gate circuits, and 128 and 129 are integrators.

In this example, the details of the integrating comparator 107 in FIG. 14 are shown. The discrimination outputs phase-synchronized by the discriminators 115 and 116 are compared in the exclusive-OR circuit 117, and an output signal, produced when there is a mismatch, is distributed to either one of the integrators 128 and 129 under the control of a gate control signal supplied from the gate control circuit 120.

When the reference phase $\Phi_1$ is displaced from the center area of the eye pattern, a difference is caused between the discrimination outputs of the reference-phase and modulated-phase discriminators 111 and 112, as a result of which the integration output of the integrator 128 or 129, whichever is associated with the direction of phase shift, increases, thereby controlling the phase adjusting circuit 113 through the comparators 121 and 122 and differential amplifier 123, to bring the phase back to the original position. The reference phase $\Phi_1$ can thus be controlled to the optimum phase automatically.

Figure 19:
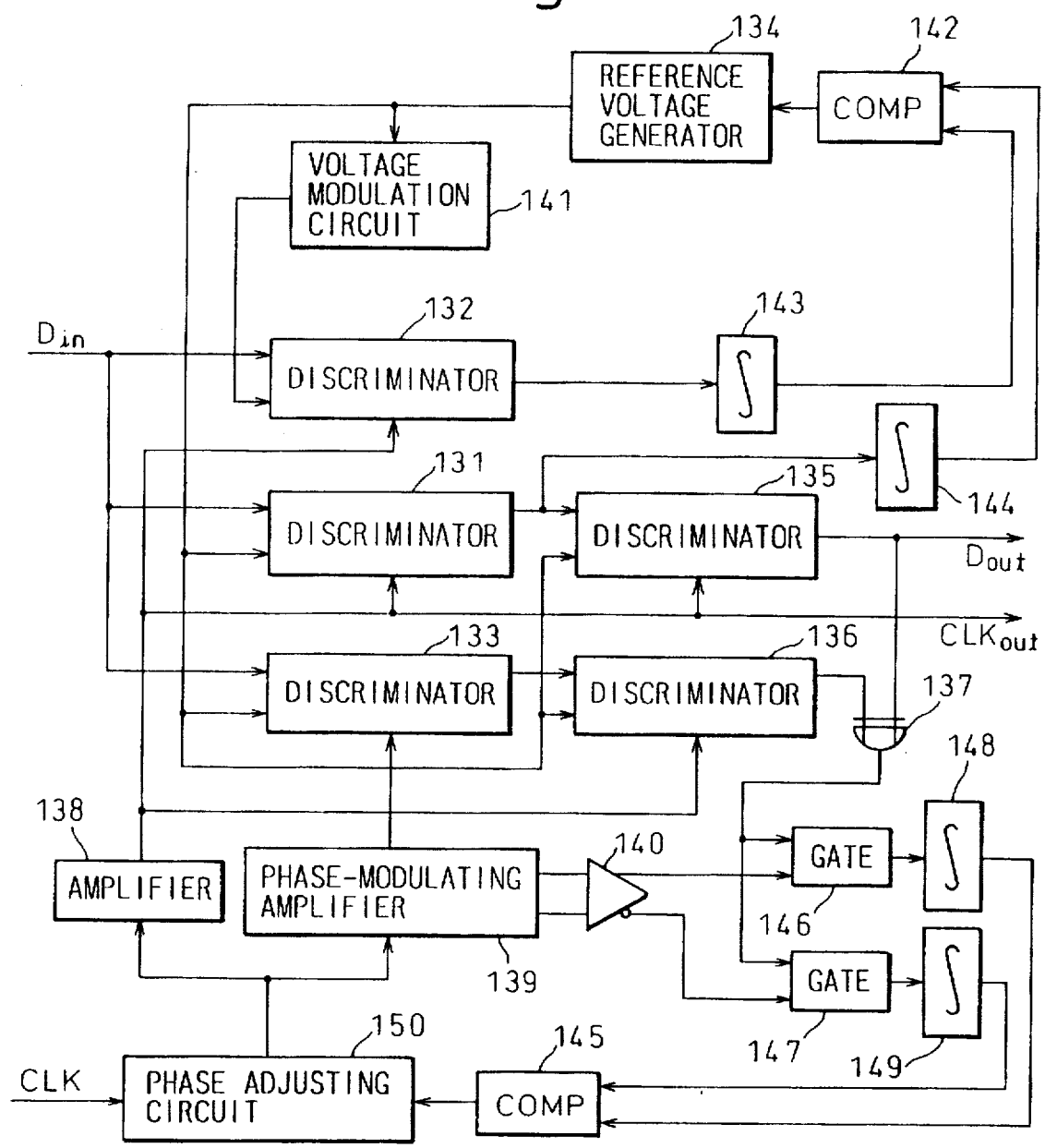
FIG. 19 is a block diagram showing a ninth example of the present invention.

FIG. 19 is a block diagram showing a ninth example of the discrimination circuit 306 of FIG. 1. In the figure, reference numerals 131 to 133 are first to third discriminators, 134 is a reference voltage generator, 135 and 136 are discriminators, 137 is an exclusive-OR circuit, 138 is an amplifier, 139 is a phase-modulating amplifier, 140 is a gate control circuit, 141 is a voltage modulation circuit, 142 is a comparator, 143 and 144 are integrators, 145 is a comparator, 146 and 147 are gate circuits, 148 and 149 are integrators, and 150 is a phase adjusting circuit. The comparator 145 may be constructed using the comparators 121 and 122 and differential amplifier 123 shown in FIG. 18.

This example combines the discrimination level control illustrated in the example of FIG. 10 with the discrimination phase control in the example of FIG. 18; therefore, the explanation already given will not be repeated here. In the present example, the first discriminator 131 discriminates the input data $D_{in}$ by using the reference voltage $V_1$ and reference phase $\Phi_1$ as the discrimination level and discrimination phase, respectively, the second discriminator 132 discriminates the input data $D_{in}$ by using $V_1 \pm \Delta V$, supplied from the voltage modulation circuit 141, as the discrimination level and the reference phase $\Phi_1$ as the discrimination phase, and the third discriminator 133 discriminates the input data $D_{in}$ by using the reference voltage $V_1$ as the discrimination level and $\Phi_1 \pm \Delta \Phi$, supplied from the phase-modulating amplifier 139, as the discrimination phase; the discrimination outputs of the discriminators 131 and 133 are phase synchronized by the discriminators 135 and 136, and then applied to the exclusive-OR circuit 137.

More specifically, the first and second discriminators 131 and 132 are used to decide whether or not the reference voltage $V_1$ is near the center of the eye pattern, and the first and third discriminators 131 and 133 are used to decide whether or not the reference phase $\Phi_1$ is near the center of the eye pattern, the first discriminator 131 being used in common between them.

The integrators 143 and 144 and the comparator 142 together constitute a voltage control circuit which controls the reference voltage generator 134 to automatically optimize the reference voltage $V_1$. On the other hand, the exclusive-OR circuit 137, the gate circuits 146 and 147, the integrators 148 and 149, the gate control circuit 140, and the comparator 145, together constitute a phase control circuit which controls the phase adjusting circuit 150 to automatically optimize the reference phase $\Phi_1$.

Figure 20A:
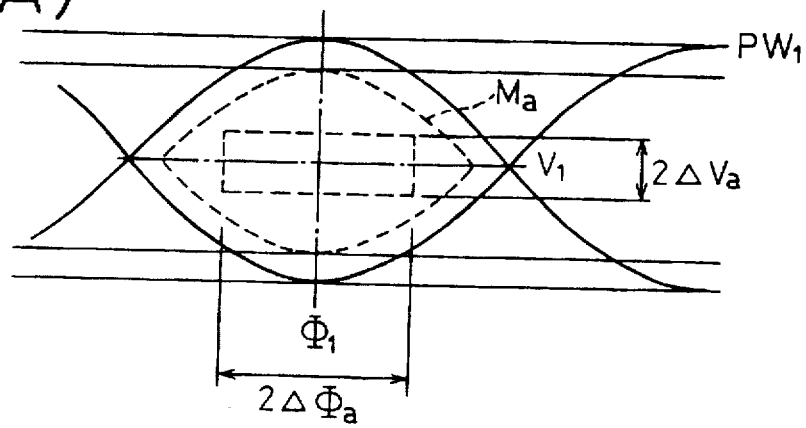
FIGS. 20A–20B are diagrams for explaining the operation of a discrimination circuit according to the ninth example of the present invention.
Figure 20B:
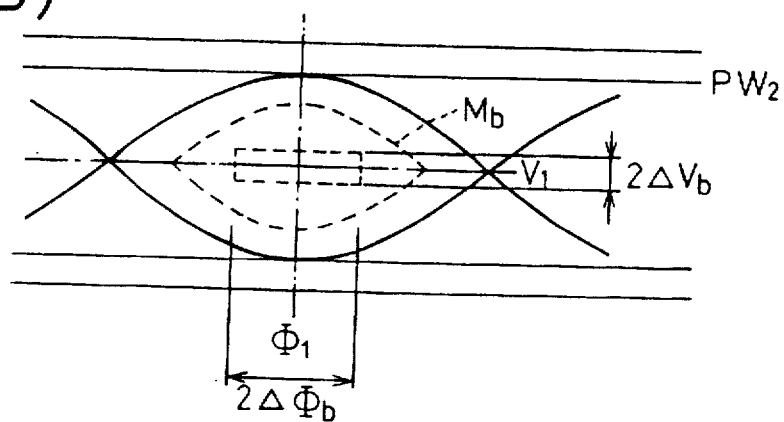

FIG. 20 is a diagram for explaining the operation of the discrimination circuit of FIG. 19. Parts (A) and (B) each show the discrimination range defined on the eye pattern by the modulated voltage and modulated phase. In (A), denoting the discrimination margin by $M_a$, the reference voltage $V_1$ is modulated within the range of and the reference phase $\Phi_1$, within the range of $2\Delta\Phi_a$ so that the modulation range falls within the range of the discrimination margin $M_a$. The modulated voltage, $V_1 + \Delta V_a$, is applied as the discrimination level to the second discriminator 132, and the modulated phase, $\Phi_1 \pm \Delta \Phi_a$, is applied as the discrimination phase to the third discriminator 133.

This means that the reference voltage $V_1$ and the reference phase $\Phi_1$ can be optimized automatically, as in the foregoing examples, with the modulation ranges of the reference voltage $V_1$ and reference phase $\Phi_1$ controlled within the discrimination margin $M_a$.

An eye pattern opens wide when received signal power is large, but when it is weak, the eye opening decreases.

Therefore, it is preferable to control the degrees of modulation of the reference voltage $V_1$ and reference phase $\Phi_1$, in fiber-optic communication systems, by detecting received optical power, or in conventional communication systems containing a fiber-optic communication system, by detecting an AGC voltage in an AGC amplifier, etc.

More specifically, assuming that FIG. 20(A) represents an eye pattern when the received signal power is $PW_1$, the degrees of modulation are controlled so that the reference voltage $V_1$ is modulated within the range of $2\Delta V_a$ and the reference phase $\Phi_1$ within the range of $2\Delta\Phi_a$, as earlier described. As the received signal power weakens and reaches $PW_2$, the eye pattern opening decreases, as shown in (B). In that case, the degrees of modulation are controlled so that the reference voltage $V_1$ is modulated within the range of $2\Delta V_b$ and the reference phase $\Phi_1$ within the range of $2\Delta\Phi_b$, thus controlling the reference voltage $V_1$ and reference phase $\Phi_1$ within the discrimination margin $M_a$. The degrees of modulation in this case can be controlled by applying a detection signal of the received signal power to the voltage modulation circuit 141 and phase-modulating amplifier 139.

Figure 21:
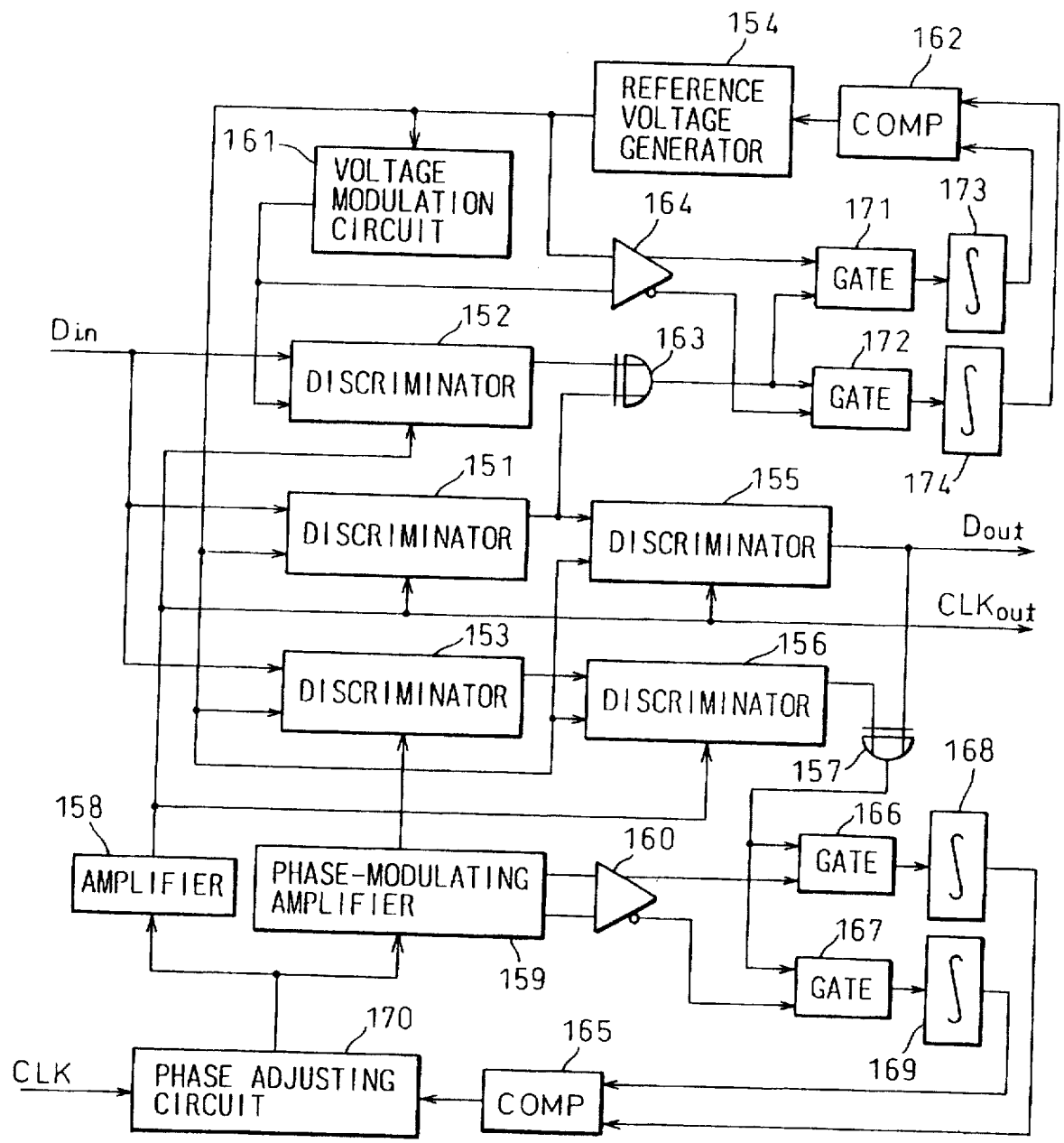
FIG. 21 is a block diagram showing a 10th example of the present invention.

FIG. 21 is a block diagram showing a 10th example of the discrimination circuit 306 of FIG. 1. In the figure, reference numerals 151 to 153 are first to third discriminators, 154 is a reference voltage generator, 155 and 156 are discriminators, 157 is an exclusive-OR circuit, 158 is an amplifier, 159 is a phase-modulating amplifier, 160 is a gate control circuit, 161 is a voltage modulation circuit, 162 is a comparator, 163 is an exclusive-OR circuit, 164 is a gate control circuit, 165 is a comparator, 166, 167, 171, and 172 are gate circuits, 168, 169, 173, and 174 are integrators, and 170 is a phase adjusting circuit. The comparators 162 and 165 may each be constructed using the comparators 121 and 122 and differential amplifier 123 shown in FIG. 18.

This example combines the discrimination level control illustrated in the example of FIG. 12 with the discrimination phase control in the example of FIG. 18. The first to third discriminators 151 to 153 are identical in configuration and operation to the first to third discriminators 131 to 133 in the example shown in FIG. 19, and therefore, the explanation already given will not be repeated here. In the present example, the exclusive-OR circuit 157, the gate circuits 166 and 167, the gate control circuit 160, the integrators 168 and 169, and the comparator 165, together constitute a phase control circuit, which controls the phase adjusting circuit 170 to optimize the reference phase $\Phi$; on the other hand, the exclusive-OR circuit 163, the gate circuits 171 and 172, the gate control circuit 164, the integrators 173 and 174, and the comparator 162, together constitute a voltage control circuit which controls the reference voltage generator 154 to optimize the reference voltage $V_1$. With this configuration, the discrimination point can be set at an optimum position without requiring any adjustment work.

The above description has dealt with a combination of the discrimination phase control illustrated in FIG. 18 and the discrimination level control in FIG. 10 or 12, but it will be appreciated that a combination with another discrimination-level control, such as the one shown in FIG. 3 or 5, or a combination with another discrimination-phase control, such as the one shown in FIG. 7 or 9, is also possible in a like manner.

Figure 22:
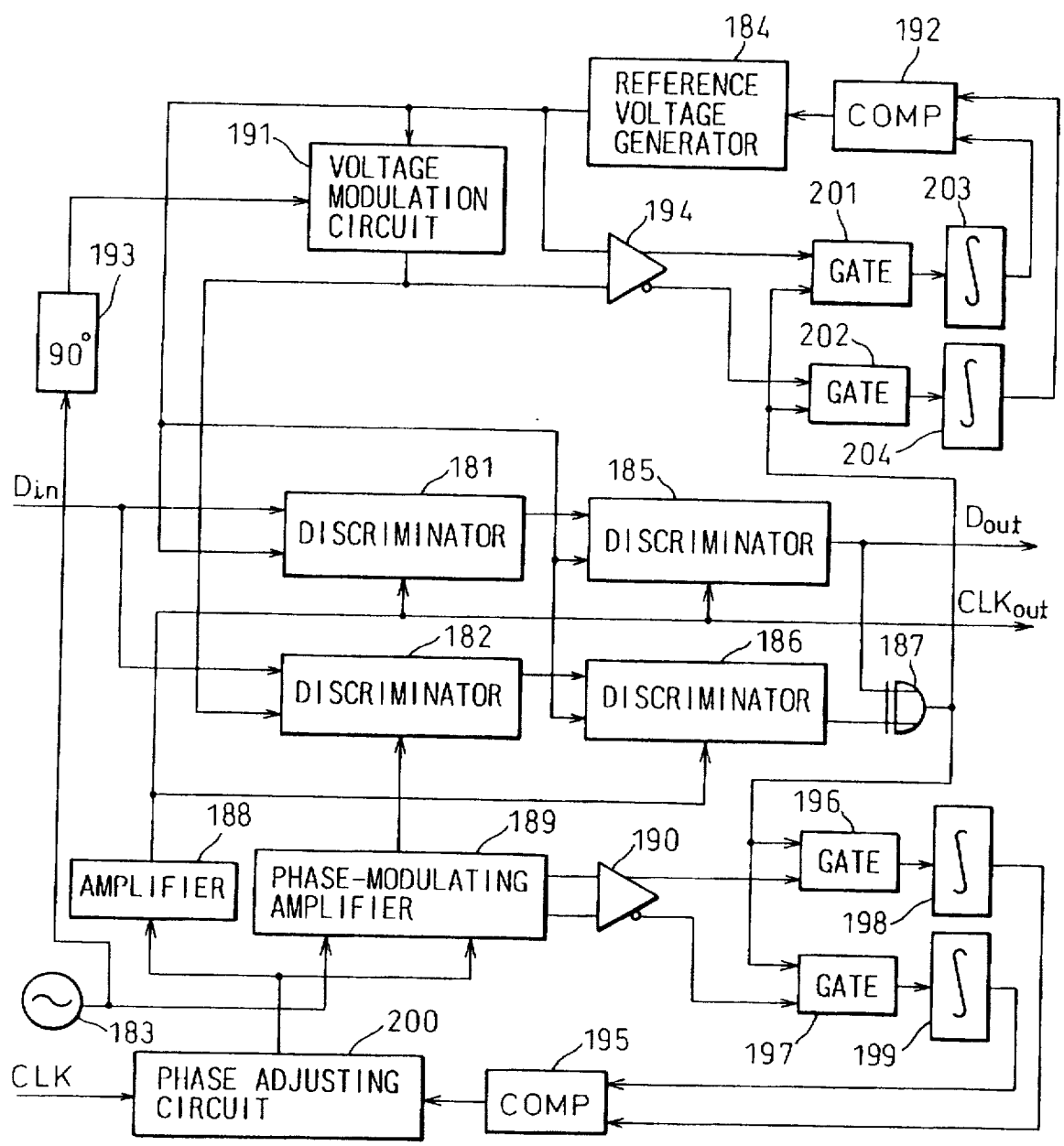
FIG. 22 is a block diagram showing an 11th example of the present invention.

FIG. 22 is a block diagram showing an 11th example of the discrimination circuit 306 of FIG. 1. In the figure, reference numerals 181 and 182 are first and second discriminators, 183 is an oscillator, 184 is a reference voltage generator, 185 and 186 are fourth and fifth discriminators, 187 is an exclusive-OR circuits, 188 is an amplifier, 189 is a phase-modulating amplifier, 190 and 194 are gate control circuits, 191 is a voltage modulation circuit, 192 and 195 are comparators, 193 is a 90-degree phase shifter, 196, 197, 201, and 202 are gate circuits, 198, 199, 203, and 204 are integrators, and 200 is a phase adjusting circuit.

In this example, an output signal of the oscillator 183 is applied as a modulating signal directly to the phase-modulating amplifier 189 and through the 90-degree phase shifter 193 to the voltage modulation circuit 191. More specifically, the phase-modulating amplifier 189 and the voltage modulation circuit 191 modulate the reference phase $\Phi_1$ and reference voltage $V_1$, respectively, with modulating signals of the same frequency but 90 degrees shifted in phase relative to each other. In the second discriminator 182 which discriminates the input data $D_{in}$ by using the modulated voltage as the discrimination level and the modulated phase as the discrimination phase, the discrimination point on the eye pattern varies in such a manner as to describe a circle or an ellipse The first discriminator 181 discriminates the input data $D_{in}$ by using the reference voltage $V_1$ as the discrimination level and the reference phase $\Phi_1$ as the discrimination phase, and outputs the result as output data $D_{out}$, while sending a clock signal $CLK_{out}$ of the reference phase $\Phi_1$ to circuits at the subsequent stage. The fourth and fifth discriminators 185 and 186, each constructed from a flip-flop, are provided to bring the out-of-phase discrimination outputs of the first and second discriminators 181 and 182 into phase. Then, the exclusive-OR circuit 187 compares the discrimination outputs, and produces an output as a result of the comparison, which output is distributed by gate control signals from the gate control circuits 194 and 190 that are synchronized to the cycle of the modulating frequency.

More specifically, the comparison output is switched so that it is distributed to the integrator 203 during the period of $V_1+\Delta V$, to the integrator 204 during the period of $V_1-\Delta V$, to the integrator 198 during the period of $\Phi_1+\Delta\Phi$, and to the integrator 199 during the period of $\Phi_1-\Delta\Phi$. Then, the comparator 192 compares the integration outputs of the integrators 203 and 204, and controls the reference voltage generator 184 to hold the reference voltage $V_1$ in the center area of the eye pattern; likewise, the comparator 195 compares the integration outputs of the integrators 198 and 199, and controls the phase adjusting circuit 200 to hold the reference phase $\Phi_1$ in the center area of the eye pattern.

FIG. 23 is a diagram for explaining the operation of the discrimination circuit of FIG. 22. Part (a) shows the discrimination point on the eye pattern, and (b) shows a modulating signal $F_1$, which is applied to the phase-modulating amplifier 189 from the oscillator 183, and a modulating signal $F_2$, which is applied to the voltage modulation circuit 191 through the 90-degree phase shifter 193. In accordance with the 90° out-of-phase modulating signals, the discrimination point on the eye pattern rotates, for example, in the direction shown by the arrow. The degrees of modulation in that case are selected so that the discrimination point varies within the range of the discrimination margin.

Parts (c) to (f) each show an example of the gate control signal: (c) is the gate control signal for opening the gate circuit 201 when the modulated voltage is in the positive region with respect to the reference voltage $V_1$; (e) is the gate control signal for opening the gate circuit 202 when the modulated voltage is in the negative region; (d) is the gate control signal for opening the gate circuit 196 when the modulated phase is in the advanced-phase region with respect to the reference phase $\Phi_1$; and (f) is the gate control signal for opening the gate circuit 197 when the modulated phase is in the delayed-phase region. These gate control signals can be easily formed by comparing the levels of the modulating signals $F_1$ and $F_2$ shown in (b).

With the gate control signals shown in (c) to (f), the output signal of the exclusive-OR circuit 187 is sequentially distributed to the respective integrators. In an alternative configuration, the gate circuits 201 and 202 may be controlled depending on whether the voltage is in the period of $V_1+\Delta V$ or $V_1-\Delta V$ and the gate circuits 196 and 197 depending on whether the phase is in the period of $\Phi_1+\Delta\Phi$ or $\Phi_1-\Delta\Phi$, as previously described, so that, during the period of $V_1+\Delta V$ and $\Phi_1+\Delta\Phi$, for example, the output signal of the exclusive-OR circuit 187 is directed to the appropriate integrators in the voltage control circuit and phase control circuit, respectively.

In any of the examples so far described, either the degree of modulation of the reference voltage $V_1$ or the degree of modulation of the reference phase $\Phi_1$, or both, can be controlled by detecting the received signal power. As a means for detecting the received signal power, a means for detecting received optical power, in a fiber-optic communication system, or a means for detecting an AGC voltage in an AGC amplifier may be used. It is also possible to provide a means for stopping the control of the reference voltage $V_1$ and reference phase $\Phi_1$ when a received-signal-off condition is detected. Such means can be implemented by an arrangement in which a detection signal from a received-signal-off detection circuit of a known configuration is applied to the reference voltage generator or the phase adjusting circuit. In a further alternative configuration, the degree of modulation of the reference voltage $V_1$ or the reference phase $\Phi_1$ may be set so it just exceeds the range of the discrimination margin, with the reference voltage $V_1$ or the reference phase $\Phi_1$ being controlled based on an error rate curve.

As described above, according to the present invention, for either the reference voltage $V_1$ or the reference phase $\Phi_1$, or both, the discrimination output when the reference voltage $V_1$ is set as the discrimination level and the reference phase $\Phi_1$ as the discrimination phase is compared with the discrimination output obtained when a voltage shifted by $\pm\Delta V$ from the reference voltage $V_1$ is set as the discrimination level or the discrimination output obtained when a phase shifted by $\pm\Delta\Phi$ from the reference phase $\Phi_1$ is set as the discrimination phase, and the reference voltage $V_1$ or the reference phase $\Phi_1$ is controlled on the basis of their difference; this offers the advantage that the reference voltage $V_1$ or the reference phase $\Phi_1$ can be optimized without requiring any adjustment work. Furthermore, when the reference voltage $V_1$ or the reference phase $\Phi_1$ changes due to aging, temperature variations, variations in supply voltage, etc., control is performed to automatically compensate for such changes; this offers the advantage that optimum reference voltage $V_1$ and reference phase $\Phi_1$ can be obtained at all times.

Furthermore, by frequency-modulating the reference voltage $V_1$ or the reference phase $\Phi_1$, it becomes possible to reduce the number of discriminators. Moreover, when the reference voltage $V_1$ and the reference phase $\Phi_1$ are modulated with signals having the same frequency but shifted 90 degrees in phase relative to each other, a discrimination point describing a circle or an ellipse on the eye pattern can be obtained. This offers the advantage of being able to control the reference voltage $V_1$ and the reference phase $\Phi_1$ at optimum levels even when the eye pattern distortion is large.

The invention offers the further advantage that by controlling the amount of $\Delta V$ relative to the reference voltage $V_1$ and the amount of $\Delta\Phi$ relative to the reference phase $\Phi_1$, or the degrees of modulation when performing frequency modulation, on the basis of various conditions including input signal power, optimum control of the discrimination level and discrimination phase can be accomplished within the range of the discrimination margin varying according to the size of the eye pattern opening.

We claim:

1. A discrimination circuit comprising:

a first discrimination section for discriminating an input signal by reference to a first discrimination criterion, and thereby regenerating a digital signal as a discrimination result;

a second discrimination section for discriminating the input signal by reference to a second discrimination criterion, which is different from the first discrimination criterion and is decided depending on the first discrimination criterion, and for outputting a discrimination result; and a control section for optimizing the first discrimination criterion by varying the first discrimination criterion so that the discrimination result from the first discrimination section becomes equal to the discrimination result from the second discrimination section.

2. A discrimination circuit according to claim 1, wherein the first discrimination criterion includes a first discrimination level with which a voltage level of the input signal is compared for discriminating the input signal, and the second discrimination criterion includes a second discrimination level higher than the first discrimination level by a predetermined amount and a third discrimination level lower than the first discrimination level by the predetermined amount.

3. A discrimination circuit according to claim 2, wherein the control section includes a first integrator for integrating the result of the discrimination performed in the first discrimination section based on the first discrimination level, second and third integrators for averaging the respective results of the discrimination performed in the second discrimination section based on the second and third discrimination levels, a first comparator for comparing an output of the first integrator with an output of the second integrator, and for outputting a signal for lowering the first discrimination level when the two outputs do not substantially agree, and a second comparator for comparing the output of the first integrator with an output of the third integrator, and for outputting a signal for raising the first discrimination level when the two outputs do not substantially agree.

4. A discrimination circuit according to claim 2, wherein the control section includes a first exclusive-OR circuit for outputting an exclusive-OR between the discrimination result based on the first discrimination level and the discrimination result based on the second discrimination level, a second exclusive-OR circuit for outputting an exclusive-OR between the discrimination result based on the first discrimination level and the discrimination result based on the third discrimination level, a first integrator for averaging the output of the first exclusive-OR circuit, and thereby outputting a signal for lowering the first discrimination level, and a second integrator for averaging the output of the second exclusive-OR circuit, and thereby outputting a signal for raising the first discrimination level.

5. A discrimination circuit according to claim 4, wherein the control section further includes a first comparator for comparing the output of the first integrator with a fixed value, a second comparator for comparing the output of the second integrator with the fixed value, and a differential amplifier for accepting, at the inputs thereof, outputs of the first and second comparators, and for outputting a signal for controlling the first discrimination level.

6. A discrimination circuit according to claim 2, further comprising a voltage modulation circuit for generating a voltage-modulated signal containing the second and third discrimination levels by modulating the voltage of a signal having the first discrimination level with a periodic signal, and for applying the voltage-modulated signal as the second discrimination criterion to the second discrimination section.

7. A discrimination circuit according to claim 6, wherein the control section includes a first integrator for averaging the result of the discrimination performed in the first discrimination section based on the first discrimination level, a second integrator for averaging the result of the discrimination performed in the second discrimination section based on the voltage-modulated signal, and a comparator for comparing an output of the first integrator with an output of the second integrator, and thereby outputting a signal for controlling the first discrimination level.

8. A discrimination circuit according to claim 6, wherein the control section includes an exclusive-OR circuit for outputting an exclusive-OR between the discrimination result based on the first discrimination level in the first discrimination section and the discrimination result based on the voltage-modulated signal in the second discrimination section, a first gate circuit for allowing the output of the exclusive-OR circuit to pass therethrough during a period in which the second discrimination level is contained in the voltage-modulated signal, a second gate circuit for allowing the output of the exclusive-OR circuit to pass therethrough during a period in which the third discrimination level is contained in the voltage-modulated signal, a first integrator for averaging the output of the first gate circuit, and thereby outputting a signal for lowering the first discrimination level, and a second integrator for averaging the output of the second gate circuit, and thereby outputting a signal for raising the first discrimination level.

9. A discrimination circuit according to claim 8, wherein the control section further includes a first comparator for comparing the output of the first integrator with a fixed value, a second comparator for comparing the output of the second integrator with the fixed value, and a differential amplifier for accepting at inputs thereof outputs of the first and second comparators, and for outputting a signal for controlling the first discrimination level.

10. A discrimination circuit according to claim 1, wherein the first discrimination criterion includes a first discrimination phase with which to determine the timing to discriminate the input signal, and the second discrimination criterion includes a second discrimination phase advanced with respect to the first discrimination phase by a predetermined amount and a third discrimination phase delayed with respect to the first discrimination phase by the predetermined amount.

11. A discrimination circuit according to claim 10, wherein the control section includes
   a first integrator for averaging the result of the discrimination performed in the first discrimination section based on the first discrimination phase,
   second and third integrators for averaging the respective results of the discrimination performed in the second discrimination section based on the second and third discrimination phases,
   a first comparator for comparing an output of the first integrator with an output of the second integrator, and for outputting a signal for delaying the first discrimination phase when the two outputs do not substantially agree, and
   a second comparator for comparing the output of the first integrator with an output of the third integrator, and for outputting a signal for advancing the first discrimination phase when the two outputs do not substantially agree.

12. A discrimination circuit according to claim 10, wherein the control section includes
   a first exclusive-OR circuit for outputting an exclusive-OR between the discrimination result based on the first discrimination phase and the discrimination result based on the second discrimination phase,
   a second exclusive-OR circuit for outputting an exclusive-OR between the discrimination result based on the first discrimination phase and the discrimination result based on the third discrimination phase,
   a first integrator for averaging the output of the first exclusive-OR circuit, and thereby outputting a signal for delaying the first discrimination phase, and
   a second integrator for averaging the output of the second exclusive-OR circuit, and thereby outputting a signal for advancing the first discrimination phase.

13. A discrimination circuit according to claim 12, wherein the control section further includes
   a first comparator for comparing the output of the first integrator with a fixed value,
   a second comparator for comparing the output of the second integrator with the fixed value, and
   a differential amplifier for accepting at inputs thereof outputs of the first and second comparators, and for outputting a signal for controlling the first discrimination phase.

14. A discrimination circuit according to claim 10, further comprising a phase modulation circuit for generating a phase-modulated signal containing the second and third discrimination phases by modulating the phase of a signal determining the first discrimination phase with a periodic signal, and for applying the phase-modulated signal as the second discrimination criterion to the second discrimination section.

15. A discrimination circuit according to claim 14, wherein the control section includes
   an exclusive-OR circuit for outputting an exclusive-OR between the discrimination result based on the first discrimination phase in the first discrimination section and the discrimination result based on the phase-modulated signal in the second discrimination section,
   a first gate circuit for allowing the output of the exclusive-OR circuit to pass therethrough during a period in which the second discrimination phase is contained in the phase-modulated signal,
   a second gate circuit for allowing the output of the exclusive-OR circuit to pass therethrough during a period in which the third discrimination phase is contained in the phase-modulated signal,
   a first integrator for averaging the output of the first gate circuit, and thereby outputting a signal for delaying the first discrimination phase, and
   a second integrator for averaging the output of the second gate circuit, and thereby outputting a signal for advancing the first discrimination phase.

16. A discrimination circuit according to claim 15, wherein the control section further includes
   a first comparator for comparing the output of the first integrator with a fixed value,
   a second comparator for comparing the output of the second integrator with the fixed value, and
   a differential amplifier for accepting at inputs thereof outputs of the first and second comparators, and for outputting a signal for controlling the first discrimination phase.

17. A discrimination circuit according to claim 2, wherein the first discrimination criterion further includes a first discrimination phase with which to determine the timing to discriminate the input signal, and the second discrimination criterion further includes a second discrimination phase advanced with respect to the first discrimination phase by a predetermined amount and a third discrimination phase delayed with respect to the first discrimination phase by the predetermined amount.

18. A discrimination circuit according to claim 17, further comprising
   a voltage modulation circuit for generating a voltage-modulated signal containing the second and third discrimination levels by modulating the voltage of a signal having the first discrimination level with a first periodic signal, and for applying the voltage-modulated signal as the second discrimination criterion to the second discrimination section, and
   a phase modulation circuit for generating a phase-modulated signal containing the second and third discrimination phases by modulating the phase of a signal determining the first discrimination phase with a second periodic signal, and for applying the phase-modulated signal as the second discrimination criterion to the second discrimination section.

19. A discrimination circuit according to claim 18, wherein the control section includes
   a first integrator for averaging the result of the discrimination performed in the first discrimination section based on the first discrimination level and the first discrimination phase,
   a second integrator for averaging the result of the discrimination performed in the second discrimination section based on the voltage-modulated signal and the first discrimination phase,
   a comparator for comparing an output of the first integrator with an output of the second integrator, and thereby outputting a signal for controlling the first discrimination level,
   an exclusive-OR circuit for outputting an exclusive-OR between the discrimination result based on the first discrimination level and the first discrimination phase in the first discrimination section and the discrimination result based on the first discrimination level and the phase-modulated signal in the second discrimination section, a first gate circuit for allowing the output of the exclusive-OR circuit to pass therethrough during a period in which the second discrimination phase is contained in the phase-modulated signal, a second gate circuit for allowing the output of the exclusive-OR circuit to pass therethrough during a period in which the third discrimination phase is contained in the phase-modulated signal, a third integrator for averaging the output of the first gate circuit, and thereby outputting a signal for delaying the first discrimination phase, and a fourth integrator for averaging the output of the second gate circuit, and thereby outputting a signal for advancing the first discrimination phase.

20. A discrimination circuit according to claim 18, wherein the control section includes a first exclusive-OR circuit for outputting an exclusive-OR between the discrimination result based on the first discrimination level and the first discrimination phase in the first discrimination section and the discrimination result based on the voltage-modulated signal and the first discrimination phase in the second discrimination section, a first gate circuit for allowing the output of the first exclusive-OR circuit to pass therethrough during a period in which the second discrimination level is contained in the voltage-modulated signal, a second gate circuit for allowing the output of the first exclusive-OR circuit to pass therethrough during a period in which the third discrimination level is contained in the voltage-modulated signal, a first integrator for averaging the output of the first gate circuit, and thereby outputting a signal for lowering the first discrimination level, a second integrator for averaging the output of the second gate circuit, and thereby outputting a signal for raising the first discrimination level, a second exclusive-OR circuit for outputting an exclusive-OR between the discrimination result based on the first discrimination level and the first discrimination phase in the first discrimination section and the discrimination result based on the first discrimination level and the phase-modulated signal in the second discrimination section, a third gate circuit for allowing the output of the second exclusive-OR circuit to pass therethrough during a period in which the second discrimination phase is contained in the phase-modulated signal, a fourth gate circuit for allowing the output of the second exclusive-OR circuit to pass therethrough during a period in which the third discrimination phase is contained in the phase-modulated signal, a third integrator for averaging the output of the third gate circuit, and thereby outputting a signal for delaying the first discrimination phase, and a fourth integrator for averaging the output of the fourth gate circuit, and thereby outputting a signal for advancing the first discrimination phase.

21. A discrimination circuit according to claim 18, wherein the first and second periodic signals are synchronized with different phases, and the control section includes an exclusive-OR circuit for outputting an exclusive-OR between the discrimination result based on the first discrimination level and the first discrimination phase in the first discrimination section and the discrimination result based on the voltage-modulated signal and the phase-modulated signal in the second discrimination section, a first gate circuit for allowing the output of the exclusive-OR circuit to pass therethrough during a period in which the second discrimination level is contained in the voltage-modulated signal, a second gate circuit for allowing the output of the exclusive-OR circuit to pass therethrough during a period in which the third discrimination level is contained in the voltage-modulated signal, a third gate circuit for allowing the output of the exclusive-OR circuit to pass therethrough during a period in which the second discrimination phase is contained in the phase-modulated signal, a fourth gate circuit for allowing the output of the exclusive-OR circuit to pass therethrough during a period in which the third discrimination phase is contained in the phase-modulated signal, a first integrator for averaging the output of the first gate circuit, and thereby outputting a signal for lowering the first discrimination level, a second integrator for averaging the output of the second gate circuit, and thereby outputting a signal for raising the first discrimination level, a third integrator for averaging the output of the third gate circuit, and thereby outputting a signal for delaying the first discrimination phase, and a fourth integrator for averaging the output of the fourth gate circuit, and thereby outputting a signal for advancing the first discrimination phase.

22. A discrimination circuit according to claim 18, wherein the degrees of modulation in the voltage modulation circuit and in the phase modulation circuit are controlled according to a received signal power.

23. An optical receiver comprising:

an optical detector for converting an optical signal into an electrical signal;

an equalizing amplifier for amplifying and equalizing an output of the optical detector;

a timing regenerator for extracting from an output of the equalizing amplifier a clock signal component contained therein; and a discrimination circuit for discriminating the output of the equalizing amplifier by reference to a discrimination criterion based on the extracted clock signal, and thereby regenerating a digital signal, wherein the discrimination circuit includes a first discrimination section for discriminating an input signal by reference to a first discrimination criterion, and thereby regenerating the digital signal as a discrimination result;

a second discrimination section for discriminating the input signal by reference to a second discrimination criterion, which is different from the first discrimination criterion and is decided depending on the first discrimination criterion, and for outputting a discrimination result; and a control section for optimizing the first discrimination criterion by varying the first discrimination criterion so that the discrimination result from the first discrimination section becomes equal to the discrimination result from the second discrimination section.

* * * * *